United States Patent [19]
Mori

[11] Patent Number: 5,926,434
[45] Date of Patent: Jul. 20, 1999

[54] SYNCHRONOUS SEMICONDUCTOR MEMORY DEVICE CAPABLE OF REDUCING ELECTRICITY CONSUMPTION ON STANDBY

[75] Inventor: Shigeru Mori, Hyogo, Japan

[73] Assignee: Mitsubishi Denki Kabushiki Kaisha, Tokyo, Japan

[21] Appl. No.: 08/998,016

[22] Filed: Dec. 24, 1997

[30] Foreign Application Priority Data

Jun. 26, 1997 [JP] Japan .................................. 9-170527

[51] Int. Cl.$^6$ ........................................... G11C 7/00
[52] U.S. Cl. ..................... 365/233; 365/193; 365/195; 365/227; 365/229
[58] Field of Search ................................. 365/233, 226, 365/227, 229, 193, 195

[56] References Cited

U.S. PATENT DOCUMENTS

| | | | |
|---|---|---|---|
| 5,521,878 | 5/1996 | Ohtani et al. | 365/233 |
| 5,587,950 | 12/1996 | Sawada et al. | 365/233 X |
| 5,623,453 | 4/1997 | Shinozaki | 365/233 |
| 5,629,897 | 5/1997 | Iwamoto et al. | 365/233 X |
| 5,764,590 | 6/1998 | Iwamoto et al. | 365/233 |
| 5,798,979 | 8/1998 | Toda et al. | 365/233 |

FOREIGN PATENT DOCUMENTS 7-177015  7/1995  Japan .
7-182857  7/1995  Japan .

OTHER PUBLICATIONS

"16Mbit Synchronous DRAM with 125Mbyte/sec Data Rate", Choi et al., 1993 Symposium on VLSI Circuit, pp. 65–66.

*Primary Examiner*—Do Hyun Yoo
*Attorney, Agent, or Firm*—McDermott, Will & Emery

[57] ABSTRACT

An internal clock generating circuit 200 applies an external clock signal Ext.CLK to a clock buffer circuit 206 in response to activation of a chip select signal ext./CS. The clock buffer circuit 206 is synchronized with the external clock signal Ext.CLK to generate an internal clock signal int.CLK. In response to inactivation of an internal circuit activating signal $\phi_{ACT}$ for designating activating an operation of an internal circuit of an SDRAM, a clock input control circuit 204 stops transmitting the external clock signal Ext.CLK and an operation for generating the internal clock signal int.CLK is stopped.

11 Claims, 16 Drawing Sheets

SYNCHRONOUS SEMICONDUCTOR MEMORY DEVICE CAPABLE OF REDUCING ELECTRICITY CONSUMPTION ON STANDBY

BACKGROUND OF THE INVENTION

1. Field of the Invention

The present invention relates to a semiconductor memory device, and particularly to a synchronous semiconductor memory device which is synchronized with an external, periodically applied clock signal to receive an external signal. More specifically, the present invention relates to a randomly accessible, synchronous dynamic random access memory (SDRAM).

2. Description of the Background Art

While dynamic random access memories (DRAMs) used as main memory have been accessed more and more rapidly, their operating speeds still cannot catch up with those of microprocessors (MPUs). It is thus often said that the access time and cycle time of DRAM are the bottleneck, which degrades the entire performance of systems. In recent years SDRAMs which operate synchronously with a clock signal have been manufactured as main memories for high-speed MPUs.

An SDRAM achieves rapid access by synchronizing with a system clock signal to rapidly access successive bits, e.g., eight bits for each of data input/output terminals. For example, 8-bit data can be successively read in an SDRAM capable of inputting and outputting data of eight bits (one byte) through data input/output terminals DQ0–DQ7. In other words, data of eight bits multiplied by eight, i.e., data of 64 bits can be read successively.

The number of bits of successively read or written data is referred as burst length, which can be changed by mode register in SDRAM.

In an SDRAM, external control signals, i.e., a row address strobe signal ext./RAS, a column address strobe signal ext./CAS, a column address strobe signal ext./CAS, an address signal Add and the like are received at a rising edge of an external clock signal Ext.CLK as a system clock, for example.

FIG. 16 is a schematic block diagram showing a configuration of an internal clock generation circuit 2000 which receives external clock signal Ext.CLK and converts it into an internal clock signal int.CLK in a conventional synchronous dynamic random access memory.

Internal clock generation circuit 2000 includes a clock input terminal 2002 which receives external clock signal Ext.CLK, an NAND circuit 2004 which receives Ext.CLK from clock input terminal 2002 at one input node and a ground potential GND at the other input node, an inverter 2006 which receives an output from NAND circuit 2004, and a clock buffer circuit 2008 which receives an output from inverter 2006 to generate an internal clock signal int.CLK with a predetermined pulse width.

For the configuration of the conventional internal clock generation circuit 2000, when an SDRAM is in standby state, external clock signal Ext.CLK is constantly input to clock buffer 2008. Thus, even when the SDRAM in standby state, clock buffer 2008 is constantly in operating state, which results in significant electricity consumption. Thus, the electricity consumption of the SDRAM in standby state cannot be reduced.

Meanwhile, a method of reducing electricity consumption in a state other than the power-down mode, e.g., standby state, in an SDRAM has been proposed, for example, in Japanese Patent Laying-Open No. 7-177015. According to this technique, a power cutting circuit is provided for an external input/output pin of an SDRAM and the power for the input first-stage circuit of the external input/output pin is cut in standby state to reduce electricity consumption. However, the technique relates to cutting the power for the input initial-stage circuit of the external input/output pin and is not pertinent to a problem to be solved by the present invention, i.e., the reduction of the electricity consumption of the internal clock generation circuit for more rapidly accessed SDRAMs.

Furthermore, Japanese Patent Laying-Open No. 7-182857 has suggested a method of reducing electricity consumption by allowing refreshing a DRAM which operates according to a clock in a microcomputer system without generating a clock signal in standby state. However, this technique is not pertinent to the internal clock generation circuit which converts an external clock signal into an internal clock signal in an SDRAM as an application of the present invention, and does not contemplate the reduction of the electricity consumption of the internal clock generation circuit for more rapidly accessed SDRAMs.

FIG. 17 is a schematic block diagram showing a configuration of an internal clock generation circuit 3000 with an improved configuration of the conventional internal clock generation circuit 2000 shown in FIG. 16.

Internal clock generation circuit 3000 includes clock input terminal 2002 which receives external clock signal Ext.CLK, an NAND circuit 3004 which is connected to clock input terminal 2002 at one input node and also receives a ground potential at the other input node, an inverter 3006 which receives an output of NAND circuit 3004, a first clock buffer circuit 3008 which receives an output from inverter 3006 to output a first internal clock signal int.CLK-A, and a second clock buffer circuit 3010 which is controlled by a signal $\phi_{ACT}$ for designating activating an operation of an internal circuit to provide a memory cell selecting operation in response to external control signals, and receives the output from inverter 3006 and outputs a second internal clock signal int.CLK-B.

More specifically, while signal $\phi_{ACT}$ attains inactive low level, the conventional internal clock generation circuit 3000 stops the operation for outputting the second internal clock signal int.CLK-B. By contrast, the first internal clock signal int.CLK-A is constantly generated and external control signals which provide a command for executing the next operation is responsively received.

Thus, while the first internal clock signal int.CLK-A is required to constantly operate to receive a command for specifying the next operation, the second internal clock signal int.CLK-B for controlling the other internal circuit operations is generated after signal $\phi_{ACT}$ is activated.

That is, when an SDRAM is in standby state and signal $\phi_{ACT}$ is inactivated (i.e., at low level), the operation of the second clock buffer 3010 is stopped and thus electricity consumption can be reduced in standby state.

However, the conventional internal clock generation circuit 3000 also requires the first clock buffer circuit 3008 to constantly operate, and sufficient reduction in electricity consumption cannot be achieved in standby state. In addition, the electricity consumption in the clock buffer circuit in standby state is increased as clock frequency is increased, i.e., as the SDRAM is operated more rapidly, and thus it is more difficult for an SDRAM with higher performance to suppress electricity consumption.

SUMMARY OF THE INVENTION

One object of the present invention is to provide an SDRAM capable of reducing electricity consumption in standby state.

Another object of the present invention is to provide an SDRAM capable of both low electricity consumption and rapid operation when the SDRAM is rapidly operated by a rapid, external clock signal.

In summary, the present invention contemplates a synchronous semiconductor memory device synchronized with an external clock signal formed of a train of a series of pulses to receive a plurality of external signals including a control signal and an address signal and output stored data, comprising a memory cell array, an internal clock generation circuit, a control circuit, a select circuit and a data input/output circuit.

The memory cell array has a plurality of memory cells arranged in a matrix. The internal clock generation circuit receives the external clock signal and generates an internal clock signal.

The internal clock generation circuit activates an operation for generating the internal clock signal in response to activation of a chip select signal for designating enabling the communication of the external signals between the synchronous semiconductor memory device and the external, and inactivates the operation for generating the internal clock signal in response to inactivation of internal circuit activating signal for activating an operation for selecting a memory cell.

The control circuit outputs the internal circuit activating signal in response to the external signals, and controls the data input/output operation of the synchronous semiconductor memory device in response to the internal clock signal and the external signals. The select circuit is controlled by the control circuit and is synchronized with the internal clock signal to select a corresponding memory cell of said memory cell array in response to an external row address signal. The data input/output circuit is synchronized with the internal clock signal to transmit and receive stored data between the selected memory cell and the external.

The internal clock generation circuit preferably includes a clock input control circuit which is controlled by a clock activating signal to start and stop outputting the external clock signal received from the external, a standby detection circuit which activates the clock activating signal in response to activation of the chip select signal and inactivates the clock activating signal in response to inactivation of the internal circuit activating signal, and a clock buffer circuit which receives and converts an output of said clock input control circuit into the internal clock signal.

In another suitable manner, the control circuit also outputs a standby designating signal for designating the standby operation of the synchronous semiconductor memory device in response to activation of the chip select signal and to the control signal while the internal circuit activating signal is inactivated, and the internal clock generation circuit includes a clock input control circuit which is controlled by a clock activating signal to start and stop outputting the external clock signal externally applied, a standby detection circuit which activates the clock activating signal in response to activation of the chip select signal and inactivates the clock activating signal in response to either inactivation of the internal circuit activating signal or activation of the standby designating signal, and a clock buffer circuit which receives and converts an output of the clock input control circuit into an internal clock signal.

In still another suitable manner, the internal clock generation circuit includes a clock input control circuit which is controlled by a clock activating signal to start and stop outputting the external clock externally applied; a standby detection circuit which activates the clock activating signal while the internal circuit activating signal is activated, and activates the clock activating signal in response to activation of the chip select signal and inactivates the clock activating signal in response to inactivation of the chip select signal while the internal circuit activating signal is inactivated; and a clock buffer circuit which receives and converts an output of the clock input control circuit into an internal clock signal.

Therefore a main advantage of the present invention is that an internal clock generation circuit starts the operation for generating an internal clock signal in response activation of a chip select signal and stops the generation of the internal clock signal in response to inactivation of an internal circuit activating signal and thus electricity consumption can be reduced in standby state.

Another advantage of the present invention is that when such an external signal that the chip select signal is activated and the internal circuit activating signal is not activated is applied in standby state, the internal clock generation circuit will not start the internal clock generating operation and thus the electricity consumption can further be decreased in standby state.

Still another advantage of the present invention is that when the chip select signal is activated and such an external signal that the internal circuit activating signal is not activated is applied, the internal clock generation circuit will not shift to the state for providing the internal clock generating operation and thus electricity consumption can be reduced in standby state.

Furthermore, even when a rapid external clock signal is provided for achieving rapid read or write operations of a synchronous semiconductor memory device, the electricity for generating the internal clock signal is not consumed in standby state and thus low electricity consumption in standby state can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
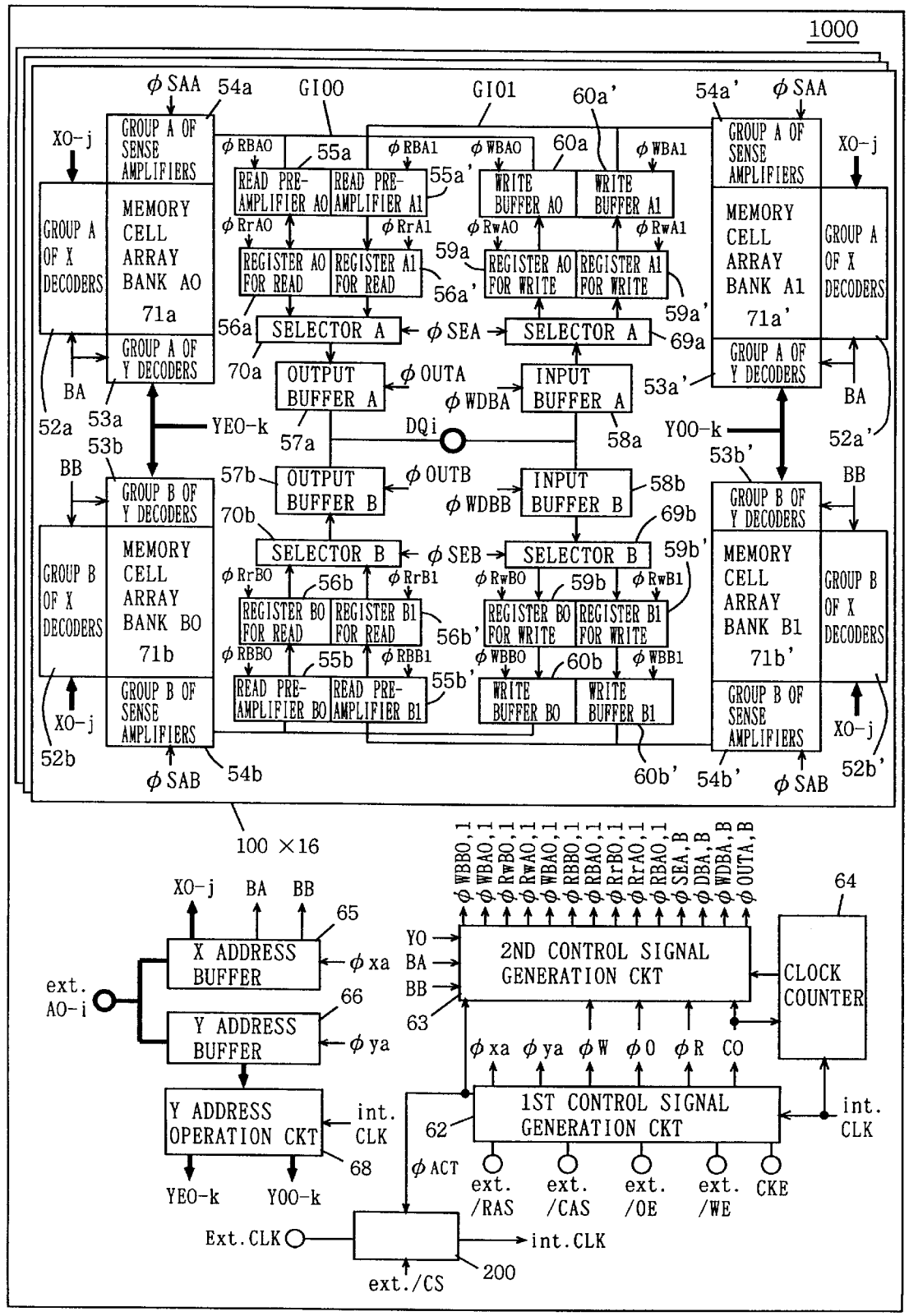
FIG. 1 is a schematic block diagram showing a configuration of an SDRAM 1000 according to a first embodiment of the present invention.

FIG. 1 is a schematic block diagram showing a configuration of an SDRAM 1000 of the present invention. As has been described above, the SDRAM is synchronized with an external clock signal to perform a synchronous operation for receiving a control signal and a data signal and thus a margin for data input/output time need not be ensured for the skew (i.e., the timing lag) of address signals. Accordingly, cycle time can be advantageously reduced. Since successive data can be written and read synchronously with a clock signal, access time can be reduced in successively accessing successive addresses.

Furthermore, as an architecture for rapidly operating an SDRAM, Choi et al. has presented a 2-bit prefetched SDRAM which provides writing/reading data for every two bits (1993 Symposium on VLSI circuit).

Hereinafter, SDRAM 1000 is assumed to have a configuration capable of the 2-bit prefetch operation described above.

It should be noted, however, that, as is apparent from the description hereinafter, the present invention can be more generally applied to reducing the electricity consumption of a synchronous semiconductor memory device which receives an external clock signal and generates an internal clock signal to control an operation of an internal circuit.

FIG. 1 shows a configuration of a functional portion related to the input/output data corresponding to one bit of an SDRAM with X 16-bit configuration. More specifically, a function block 100 is provided for each data input/output terminal, and the SDRAM with X 16-bit configuration includes 16 function blocks 100 for their respective input/output terminals. The exemplified function block 100 itself has been generally used in conventional SDRAMs and the configuration and operation thereof will now be described.

In function block 100 shown in FIG. 1, the memory cell array portion associated with a data input/output terminal DQi includes memory cell arrays 71a and 71a' forming a bank A, and memory cell arrays 71b and 71b' forming a bank B.

Bank A and bank B are divided into memory cell array banks A0 and A1 and memory cell array banks B0 and B1 selected according to address signals, respectively.

Memory cell array banks A0 and A1 are each provided with a group of X decoders 52a including a plurality of row decoders for decoding address signals ext.A0–ext.Ai to select corresponding row of memory cell array 71a, a group of Y decoders 53a including a plurality of column decoders for decoding internal column address signals Y1–Yk to generate a column select signal for selecting corresponding columns of memory cell array 71a, and a group of sense amplifiers 54a for detecting and amplifying the data of the memory cells connected to the selected row of memory cell array 71a.

The group of X decoders 52a includes row decoders each provided for each word line of memory cell array 71a. According to internal address signals X0–Xi generated in responsive to external address signals ext.A0–ext.Ai, a corresponding row decoder selects its respective word line.

The group of Y decoders 53a includes column decoders each provided for a column select line of memory cell array 71a. One column select line selects, for example, four pairs of bit lines. The group of X decoders 52a and the group of Y decoders 53a simultaneously select memory cells of four bits in each of memory cell array banks A0 and A1. The group of X decoders 52a and the group of Y decoders 53a are each activated by a bank designating signal BA.

Memory cell array banks B0 and B1 are each provided with a group of X decoders 52b and a group of Y decoders 53b which are each activated by a bank designating signal BB.

Bank A is also provided with an internal data transmission line (a global I/O line) for transmitting the data detected and amplified by the group of sense amplifiers 54a and for transmitting written data to a selected memory cell in memory cell array 71a.

Memory cell array bank A0 is provided with a global IO line bus GIO0, and memory cell array bank A1 is provided with a global IO line bus GIO1. One global IO line bus includes four pairs of global IO lines for simultaneously transmitting and receiving data to and from simultaneously selected memory cells of four bits.

The pairs of global IO lines GIO0 for memory cell array bank A0 are provided for a register 59a for write and a group of write buffers 60a, and the pairs of global IO lines GIO1 for memory cell array bank A1 are provided for a register 59a', for write and a group of write buffers 60a'.

An input buffer 58a of 1-bit width generates internal written data from the data input from data input/output terminal DQi. A selector 69a, controlled by a selector control signal φSEA output from a second control signal generating circuit 63, switches and inputs an output of input buffer 58a to either register 59a for write or register 59a' for write.

More specifically, input buffer 58a is activated in response to an input buffer activating signal φWDBA to generate internal written data from the data input from data input/output terminal DQi, and selector 69a is controlled in response to selector control signal φSEA ground-output from the second control signal generating circuit 63 in response to an address signal to output the internal written data to one of registers 59a and 59a' for write.

Registers 59a and 59a' for write is activated in response to register activating signals φRwA0 and φRwA1, respectively, to successively store written data output from selector 69a. The groups of write buffers 60a and 60a' are activated in response to write buffer activating signals φWBA0 and φWBA1 to amplify the data stored in their respective registers 59a and 59a' for write and transmit the amplified data to the buses of pairs of global IO lines GIO0 and GIO1, respectively.

The double-system pairs of global IO lines GIO0 and GIO1 are commonly provided with an equalizer circuit (not shown) which is activated in response to an equalizer circuit activating signal φWEQA (not shown) to equalize the buses of pairs of global IO lines GIO0 and GIO1.

The groups of write buffers 60a and 60a' and write registers 59a and 59a' each have a width of eight bits.

Memory cell array bank B similarly includes memory cell array banks B0 and B1 which each include a group of X decoders 52b, a group of Y decoders 53b, a group of sense amplifiers 54b activated in response to a sense amplifier activating signal φSAB, groups of write buffers 60b and 60b' activated in response to buffer activating signals φWBB0 and φWBB1, registers for write 59b and 59b' activated in response to register activating signals φRWB0 and φRwB1, selectors 69b and 70b controlled by a selector control signal φSEB, and an input buffer 58b activated in response to a buffer activating signal φWDBB.

The configuration of bank A is the same as that of bank B. The provision of registers for write 59a and 59' and 59b and 59b' allows data input/output through one data input/output terminal DQi synchronously with a rapid clock signal.

As to various control signals for banks A and B, only control signals for one of the banks are generated in response to bank designating signals BA and BB.

In a function block for a data read signal, data detected and amplified by the group of sense amplifiers 54a is transmitted on bus GIO of an internal data transmission line (a global IO line) provided for bank A.

Provided for reading data are a read preamplifier 55a activated in response to a preamplifier activating signal φRBA0 for amplifying the data on global IO line bus GIO0 for bank A0, and a register for read 56a activated in response to a register activating signal φRrA0 for storing the data amplified by read preamplifier 55a.

Also provided are a read preamplifier 55a' activated in response to a preamplifier activating signal φRBA1 for amplifying the data on global IO line bus GIO1 provided for bank A1, and a register for read 56a' activated in response to a register activating signal φRrA1 for storing the data amplified by read preamplifier 55a'.

Function block 100 shown in FIG. 1 also includes a selector 70a which receives the data from registers 56a and 56a' for read and successively outputs one of the received data in response to selector signal φSEA, and an output buffer 57a which receives the output from selector 70a and successively output the data.

Read preamplifier 55a and register for read 56a each have a width of four bits for four pairs of global IO lines. Register 56a for read latches and successively outputs the data output from read preamplifier 55a in response to register activating signal φRrA1.

Read preamplifiers 55a' and register 56' for read operate similarly.

An output buffer 57a is responsive to an output enable signal φOUTA for transmitting 8-bit data successively output from selector for read 70a to data input/output terminal DQi. Although data is input and output via data input/output terminal DQi in FIG. 1, data may be input and output via separate terminals.

Memory cell array bank B has exactly the same configuration: read preamplifiers 55b and 55b, activated by read preamplifier activating signals φRBB0 and φRBB1, respectively, registers 56b and 56b' for read activated by register activating signals φRrB0 and φRrB1, respectively, a selector 70b which selectively outputs one of the outputs of registers for read 56b and 56b' in response to signal φSEB, and an output buffer 57b which outputs the output data from selector 70b to data input/output terminal DQi in response to a signal φOUTB.

Since banks A and B have almost the same configuration and only one of them is selected in response to bank designating signals BA and BB, banks A and B can operate almost independently of each other.

A first control signal generating circuit 62, a second control signal generating circuit 63 and a clock counter 64 are provided as a control system for independently driving banks A and B.

Synchronously with an external clock signal Ext.CLK, the first control signal generating circuit 62 receives externally applied control signals, i.e., an external row address strobe signal ext./RAS, an external column address strobe signal ext./CAS, a chip select signal ext./CS and an external write enable signal ext./WE, a clock enable signal CKE, and generates internal control signals φxa, φya, φW, φO, φR and C0.

φO is a signal for designating outputting the control signal φOUTA or φOUTB for directing output buffer 57a or 57b to provide data output operation.

Signal φW indicates that write operation is designated, and signal φR indicates that read operation is designated.

Chip select signal ext./CS indicates that receiving the other control signals is enabled when the signal attains active low level. More specifically, when signal ext./CS attains inactive high level, taking the other control signals into the first control signal generating circuit 62 is prohibited.

Signal C0 is a one-short pulse signal generated in response to activation of signal ext./CS and in synchronization with internal clock signal int.CLK.

As will be apparent from the following description, combinations of signals ext./RAS, ext./CAS and ext./WE designate the activation, read operation, write operation, precharge operation, refresh operation and the like of SDRAM 1000.

The second control signal generating circuit 63 generates bank designating signals BA and BB, the least significant bit Y0 of an external address signal, internal control signals φW, φO, φR and C0, and control signals for independently driving banks A and B in response to an output of clock counter 64, i.e. sense amplifier activating signals φSAA and φSAB, write buffer activating signals φWBA0, φWBA1, φWBB0 and φWBB1, signals for activating the registers for write φRWA0, φRwA1, φRwB0 and φRwB1, selector control signals φSEA and φSEB, input buffer activating signals φWDBA and φWDBB, read preamplifier activating signals φRBB0, φRBB1, φRBA0 and φRBA1, signals for activating the registers for read φRrB0, φRrB1, φRrA0 and φRrA1, and output buffer activating signals φOUTA and φOUTB.

SDRAM 1000 further includes as peripheral circuits an X address buffer 65 which is responsive to an internal control signal φxa for receiving external address signals ext.A0–ext.A1 and generating internal address signals X0–Xj and bank selecting signals BA and BB, and a Y address buffer 66 activated in response to an internal control signal φya for outputting internal column address signals Y0–Yk for specifying column select lines. SDRAM 1000 also includes a Y address operation circuit 68 controlled by clock signal CLK for outputting signals YE0–YEk and signals YO0–YOk corresponding to selected column addresses as a peripheral circuit.

It should be noted that signals YE0–YEk represent internal column address signals corresponding to column addresses in memory cell array bank A0 or B0 and that signals YO0–YOk represent internal column address signals corresponding to column addresses in memory cell array bank A1 or B1.

Although there are two banks in the above description, the number of banks can be increased and registers, buffers and I/O lines can be accordingly provided. In this example also, the banks can be accessed independently.

Data is written into memory cell array bank A0 or A1 according to the least significant bit of an address applied when a write command is input. Briefly describing the operation, when a write command is input, a Y decoder is activated according to an applied address. The first data is stored into a register A0, and then the data stored in register A0 is written via I/O line GIO0 into memory cell array bank A0 in response to activation of signal φWBA0.

The data received at the next rising edge of the clock signal is stored into register A1, and then written via I/O line GIO1 into memory cell array bank A1 in response to activation of signal φWBA1. When writing the data of two bits is completed, signals φBA0 and φBA1 are inactivated and the potential levels of I/O lines GIO0 and GIO1 connecting the memory cell arrays to the buffers are equalized for writing the next data.

SDRAM 1000 also includes an internal clock generation circuit 200 controlled in response to a signal $\phi_{ACT}$ generated for designating activating a circuit operation of an internal circuit and to chip select signal ext./CS for generating internal clock signal int.CLK.

More specifically, internal clock generation circuit 200 is activated in response to activation of chip select signal ext./CS, and receives and is synchronized with external clock signal Ext.CLK and starts an operation for generating internal clock signal int.CLK with a predetermined pulse width. Furthermore, internal clock signal generating circuit 200 stops the operation for generating internal clock signal int.CLK when signal $\phi_{ACT}$ is inactivated.

More specifically, every time some command is input to SDRAM 100 on standby, chip select signal ext./CS need be activated and responsively internal clock generation circuit 200 starts the operation for generating internal clock signal int.CLK. On the contrary, when activating the SDRAM 1000 is designated, a data write operation or data read operation is completed and the internal circuit shifts to standby state, signal $\phi_{ACT}$ for designating activating the internal circuit attains inactive low level. Responsively internal clock generation circuit 200 stops its operation. Thus, the circuit operation for generating internal clock signal int.CLK is stopped in SDRAM 1000 on standby and thus electricity consumption can be reduced.

Figure 2:
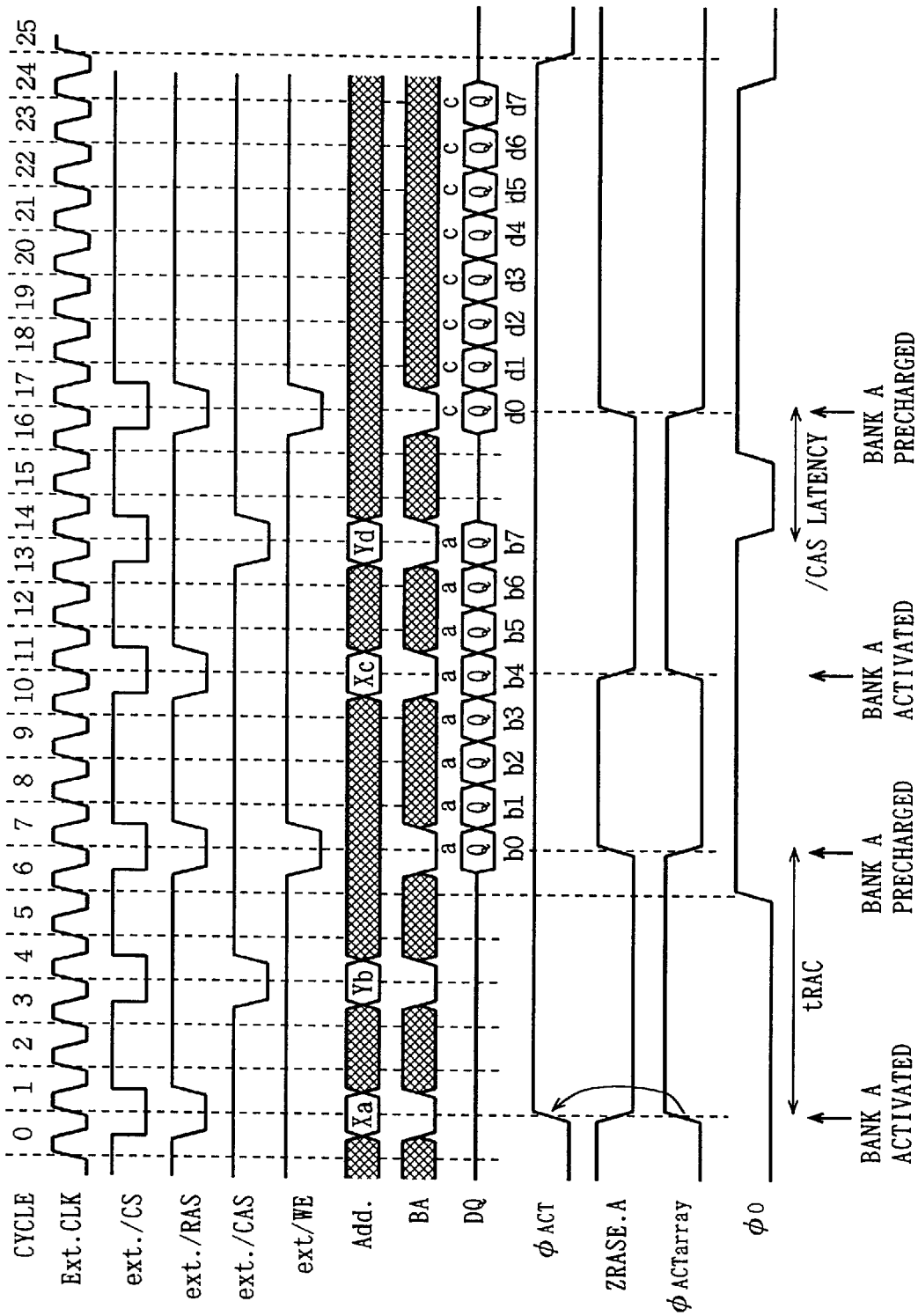
FIG. 2 is a timing chart for illustrating a read operation of SDRAM 1000.

FIG. 2 is a timing chart for illustrating a read operation of the SDRAM 1000 shown in FIG. 1.

FIG. 2 shows an example with a burst length of eight and a /CS latency of three.

At the rising edge of external clock signal Ext.CLK in cycle 1, a row address Xa is taken into SDRAM 1000 when chip select signal ext./CS and row address strobe signal ext./RAS each attain an active low level. Meanwhile, at the rising edge of external clock signal Ext.CLK in cycle 1 when signal ext./RAS attains a low level and signals ext./CAS and ext./WE each attain a high level, a signal $\phi_{ACTarray}$, i.e., the inverted version of a signal ZRASE-A for designating activating the internal circuit, attains an active high level and signal $\phi_{ACT}$ is responsively activated for designating activating the internal circuit. In other words, bank A is activated in response to an address signal.

Then, at the rising edge of external clock signal Ext.CLK in cycle 4 when signals ext./CS and ext./CAS each attain an active low level, a column address signal Yb is taken into SDRAM 1000. When the receiving of the column address signal is completed, a signal φO for designating data output attains an active high level at the rising edge of external clock signal Ext.CLK in cycle 6. Then, at the rising edge of the external clock signal Ext.CLK in cycle 7 when signals ext./CS, ext./RAS and ext./WE each attain an active high level, precharging the bank A is designated and signal $\phi_{ACTarray}$ for designating activating the memory array responsively attains an inactive low level.

Meanwhile, read data B0–B7 are successively output in synchronization with external clock signal Ext.CLK to the external of the SDRAM, starting at the rising edge of external clock signal Ext.CLK in cycle 7, which is three cycles after cycle 4, due to the /CS latency of three.

At the rising edge of external clock signal Ext.CLK in cycle 11 when signals ext./CS and ext.RAS each attain an active low level, a row address signal Xc for designating the next selected row is taken into SDRAM 1000. Meanwhile, signal $\phi_{ACTarray}$ shifts to an active state and bank A is activated.

At the rising edge of external clock signal Ext.CLK in cycle 14 when the outputting of read data B7 is completed, signal φO responsively shifts to an inactive state.

Furthermore, when external clock signal Ext.CLK rises in cycle 16, data d0–d7 of eight bits successively read from the addresses specified by address signals Xc and Yd are output successively in synchronization with external clock signal Ext.CLK, starting at the rising edge of external clock signal Ext.CLK in cycle 17, which comes three cycles after the rising edge of external clock signal Ext.CLK in cycle 14, due to the /CSD latency of three.

Meanwhile, at the rising edge of external clock signal Ext.CLK in cycle 17 when signals ext./CS, ext./RAS and ext./WE each attain an active low level, the operation for precharging bank A is responsively designated and signal $\phi_{ACTarray}$ attains an inactive low level.

When the outputting of read data d7 is completed, signal φO is responsively inactivated. Thus, at the rising edge of external clock signal Ext.CLK in cycle 25, signal $\phi_{ACT}$ also attains an inactive low level in response to the inactive states of signals $\phi_{ACTarray}$ and φO and the inactivation of the circuit operation of the internal circuit.

Figure 3:
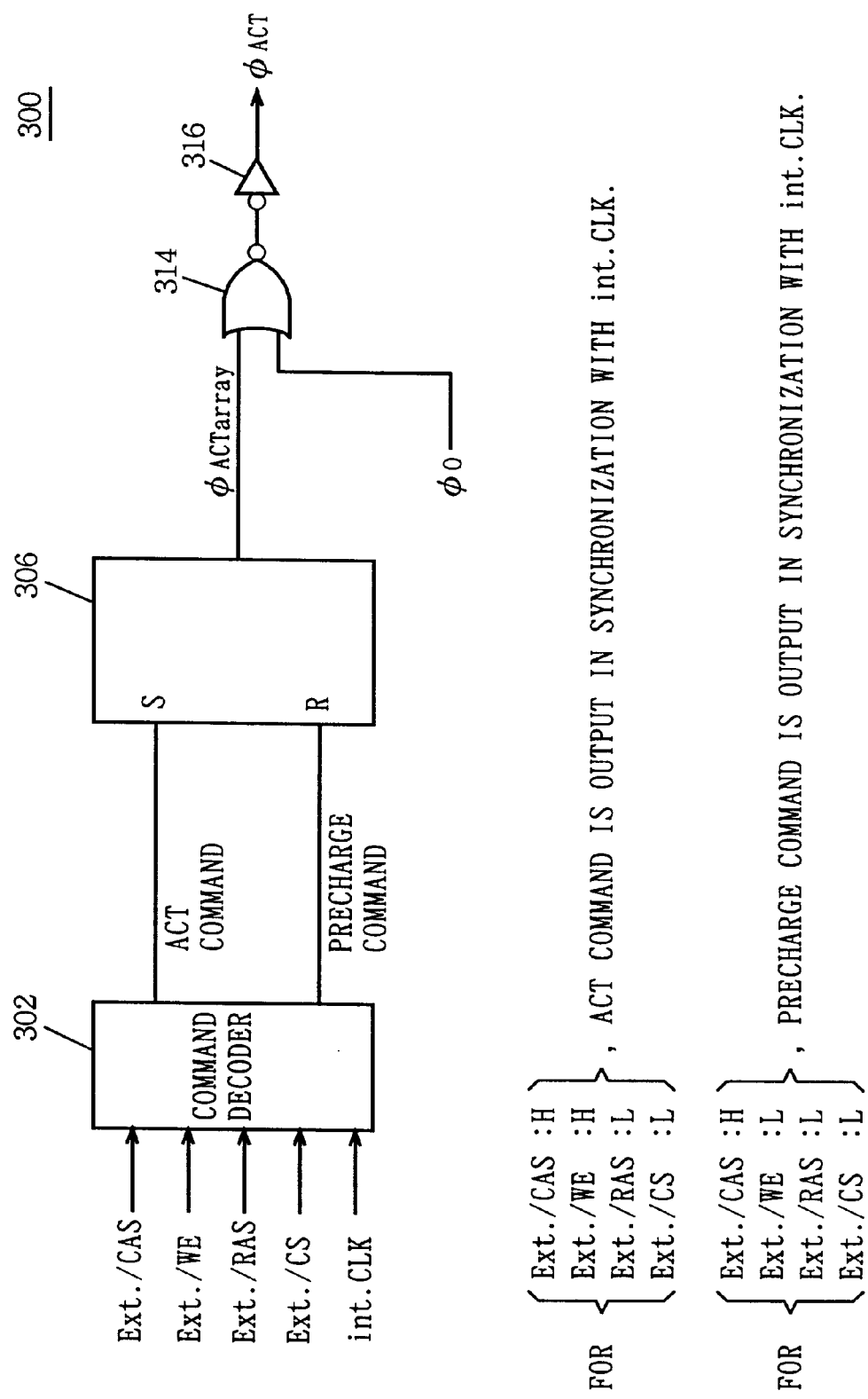
FIG. 3 is a schematic block diagram showing a configuration of a circuit 300 for designating activating an internal circuit.

FIG. 3 is a schematic block diagram showing a configuration of an internal circuit activation designating circuit 300 for generating internal circuit activating signal $\phi_{ACT}$.

Internal circuit activation designating circuit 300 includes a command decoder 302 which provides logic combinations of signals ext./CAS, ext./CS, ext./RAS and ext./WE and internal clock signal int.CLK to generate an act command and a precharge command, an S-R flipflop circuit 306 which receives the act command and the precharge command as a set signal and a reset signal, respectively, and outputs signal $\phi_{ACTarray}$, an NOR circuit 314 which receives signals $\phi_{ACTarray}$ and $\phi O$ and an inverter 316 which receives an output of NOR circuit 314 and outputs signal $\phi_{ACT}$.

More specifically, when signals ext./CAS and ext./WE each attain an inactive high level and signals ext./RAS and ext./CS each attain an active low level, internal circuit activation designating circuit 300 responsively activates signal $\phi_{ACTarray}$ in synchronization with internal clock int.CLK. When signal ext./CAS attains an inactive high level and signals ext./RAS, ext./CS and ext./WE each attain an active low level, the circuit 300 responsively inactivate signals $\phi_{ACTarray}$ in synchronization with internal clock signal int.CLK.

It should be noted that the precharge command includes a precharge instruction which is generated in an operation in the mode in which precharging is automatically provided when an internal operation is completed.

Thus, signal $\phi_{ACT}$ is activated when either of the signal $\phi_{ACTarray}$ and the signal $\phi 0$ is activated. The activation of signal $\phi_{ACTarray}$, means that any of the banks is activated. The activation of signal $\phi O$ means that data output is activated.

Figure 4:
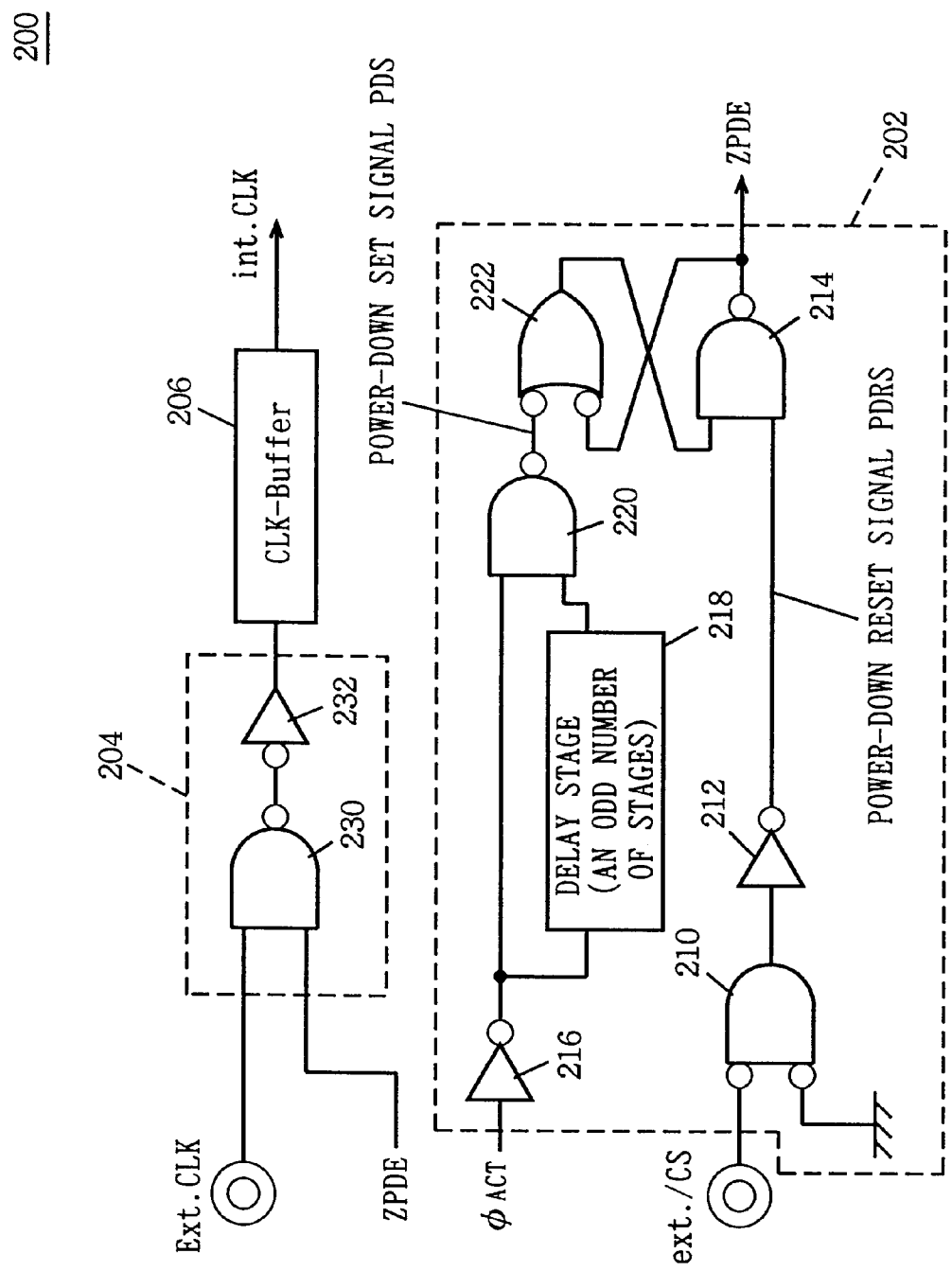
FIG. 4 is a schematic block diagram showing a configuration of an internal clock generation circuit 200 according to the first embodiment.

FIG. 4 is a schematic block diagram for showing more specifically a configuration of internal clock generating circuit 200 shown in FIG. 1.

Internal clock generation circuit 200 includes a standby detection circuit 202 for detecting that a standby state is designated in SDRAM 1000 in response to signals $\phi_{ACT}$ and ext./CS and for inactivating a clock activating signal ZPDE in the standby state, a clock input control circuit 204 controlled in response to signal ZPDE and receiving external clock signal Ext.CLK for transparently outputting external clock signal Ext.CLK when signal ZPDE is activated and for stopping outputting signal Ext.CLK when signal ZPDE is inactivated, and a clock buffer 206 receiving an output of clock input control circuit 204 and synchronizing with external clock signal Ext.CLK for converting the output into internal clock signal int.CLK with a predetermined pulse width.

Standby detector circuit 202 includes an NOR circuit 210 which receives chip select signal ext./CS at one input node and a ground potential at the other input node, an inverter 212 which receives, inverts and outputs an output of NOR circuit 210, an inverter 216 which receives, inverts and outputs signal $\phi$ACT output, a delay stage 218 which receives, delays for a predetermined period of time, then inverts and outputs an output of inverter 216, an NAND circuit 220 which receives the output of inverter 216 and an output of delay stage 218, an NAND circuit 222 which receives a power-down set signal PDS as an output signal of NAND circuit 220 at one input and clock activating signal ZPDE at the other input, and an NAND circuit 214 which receives an output of NAND circuit 222 at one input node and a power-down reset signal PDRS as an output signal of inverter 212 at the other input node to output signal ZPDE.

Clock input control circuit 204 includes an NAND circuit 230 which receives external clock signal Ext.CLK at one input node and signal ZPDE at the other input node, and an inverter 232 which receives, inverts an outputs an output of NAND circuit 230.

Figure 5:
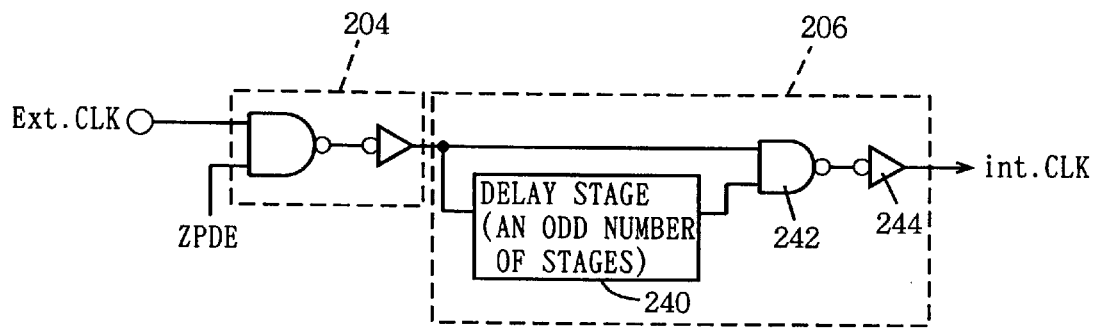
FIG. 5 is a schematic block diagram showing a configuration of a clock buffer 206.

FIG. 5 is a schematic block diagram showing more specifically a configuration of clock buffer 206 shown in FIG. 4.

Clock buffer 206 includes a delay circuit 240 with an odd number of stages that receives, delays for a predetermined period of time and outputs the output of clock input control circuit 204, an NAND circuit 242 which receives an output of delay circuit 240 and the output of clock input control circuit 204, and an inverter 244 which receives and inverts an output of NAND circuit 242 to output internal clock int.CLK.

Figure 6:
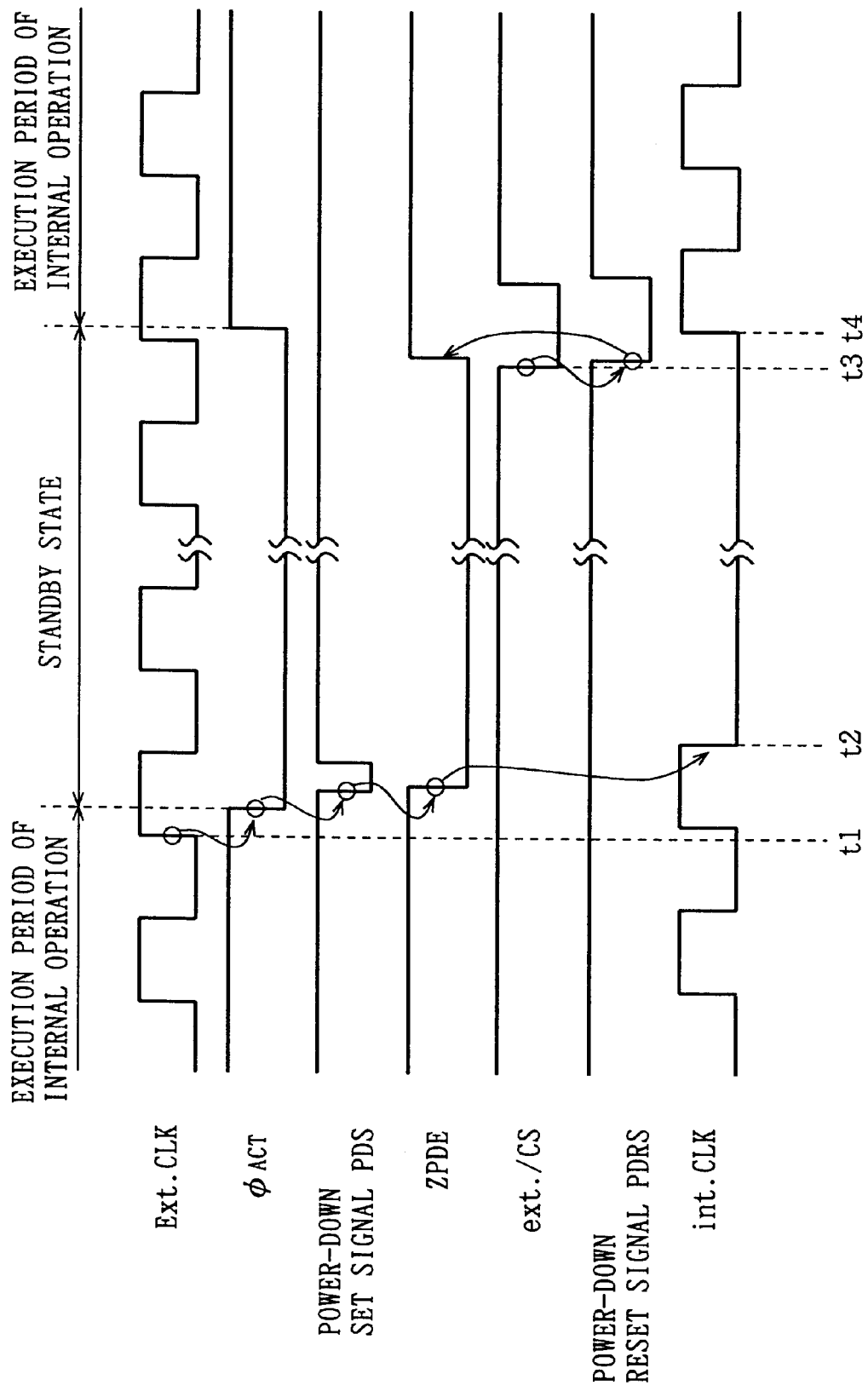
FIG. 6 is a timing chart for illustrating an operation of internal clock generation circuit 200.

FIG. 6 is a timing chart for illustrating an operation of the internal clock generation circuit shown in FIG. 4.

In response to the rising edge of external clock signal Ext.CLK at time point t1 when signals $\phi_{ACTarray}$ and $\phi O$ each attain an inactive state, signal $\phi_{ACT}$ attains an inactive low level.

Responsively, power-down set signal PDS in standby detector circuit 202 attains an active low level for the predetermined period of time determined by delay stage 218. In response to the activation of power-down set signal PDS, signal ZPDE attains an inactive low level. Responsively, clock input control circuit 204 stops outputting external clock signal Ext.CLK to clock buffer 206. Accordingly, the operation for outputting internal clock signal int.CLK is stopped at time point t2.

When chip select signal ext./CS then attains an active low level at time point t3, power-down reset signal PDRS in standby detector circuit 202 responsively attains an active low level. Responsively, signal ZPDE output from NAND circuit 214 again returns to an active high level.

When signal ZPDE attains the active state, outputting internal clock signal int.CLK is responsively resumed after time point t4.

Thus, in SDRAM 1000 according to the first embodiment, outputting internal clock signal int.CLK from internal clock generation circuit 200 is started responsively when chip select signal ext./CS attains an active low level to externally apply some command to SDRAM 1000 when SDRAM 1000 is in standby state. The operation for outputting internal clock signal int.CLK is stopped in response to inactivation of signal $\phi_{ACT}$ activated when the internal circuit is activated, i.e., when a bank is activated or data is output within SDRAM 1000.

Thus, when SDRAM 1000 is in standby state, clock buffer 206 for outputting internal clock signal int.CLK does not operate and thus the electricity consumption in the standby state can be suppressed.

In addition, the set-up time for chip select signal ext./CS with respect to external clock signal Ext.CLK is generally defined as a standard of 2 ns (or 3 ns), since signal ext./CS is externally input asynchronously. Accordingly, when signal ZPDE returns to an active high level within 2 ns (or 3 ns) after signal ext./CS attains a low level, the operation for outputting internal clock signal int.CLK will be started and any problem in the standard will not be caused. Generally, the aforementioned time of 2 ns (or 3 ns) is a standard which accommodates asynchronous inputting of signal ext./CS, and thus such a margin can be ensured for rapid data read and write operations.

In other words, for rapid SDRAM operation, low electricity consumption can be achieved in SDRAM 1000 on standby without affecting a margin for read and write operations.

Thus, the operation of the present invention based on a chip select signal externally input asynchronously is fundamentally different from the prior art of cutting the power for the input initial-stage circuit of an external input/output pin of an SDRAM in standby state, and is also fundamentally different from the prior art of simply stopping the generation of a clock signal when a DRAM in a microcomputer system is in standby state.

Second Embodiment

Figure 7:
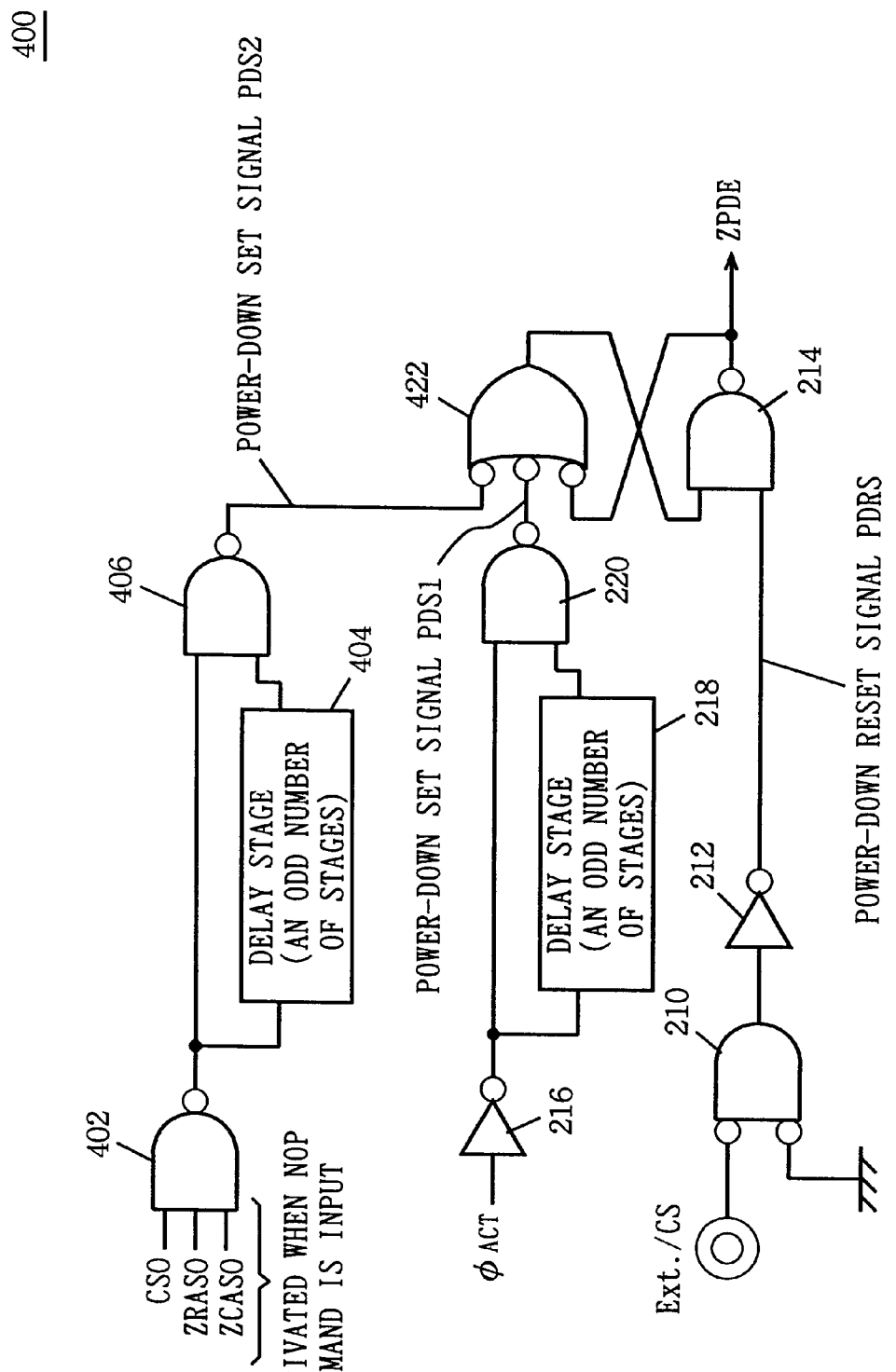
FIG. 7 is a schematic block diagram showing a configuration of a standby detection circuit 400 according to a second embodiment of the present invention.

FIG. 7 is a schematic block diagram showing a configuration of a standby detector circuit 400 in an internal clock generation circuit according to a second embodiment of the present invention.

A configuration of an SDRAM according to the second embodiment is identical to that of SDRAM 1000 shown in FIG. 1 except for the configuration of standby detector circuit 400 shown in FIG. 7.

Standby detector circuit 400 differs from the configuration of standby detector circuit 202 according to the first embodiment shown in FIG. 4 in that standby detector circuit 400 includes an NAND circuit 402 which changes an output signal to high level while chip select signal ext./CS is activated when a command for designating a standby operation (i.e., a no operation command, referred to as an NOP hereinafter) is input to the SDRAM, a delay stage 404 which receives, delays for a predetermined period of time, then inverts and outputs the output of NAND circuit 402, and an NAND circuit 406 which receives the output of NAND circuit 402 and an output of delay stage 404 to output a second power-down set signal PDS2.

Hereinafter, a signal output from NAND circuit 220 which receives the output of delay stage 218 for receiving a signal resulting from inversion of signal $\phi_{ACT}$ by inverter 216, delaying the resultant signal for the predetermined period of time and outputting the delayed signal, and the output from inverter 216 will be referred to as a first power-down set signal PDS1.

Furthermore, standby detector circuit 400 is different in configuration from standby detector circuit 200 in that the NAND circuit receiving power-down set signal PDS and signal ZPDE as an output of NAND circuit 214 is replaced with a 3-input NAND circuit 422 for receiving signals ZPDE, PDS1 and PDS2.

The rest of the configuration of standby detector circuit 400 is similar to that of standby detector circuit 200 shown in FIG. 4 and thus identical portions are designated by identical reference characters and a description thereof is not repeated.

To designate the NOP command here, chip select signal ext./CS need attain an active low level, signal ext./RAS a high level, signal ext./CS a high level and signal ext./WE a high level at a rising edge of external clock signal Ext.CLK.

When the external control signals attain such levels as described above, internal control signals CS0, ZRAS0 and ZCAS0 are generated in the first control signal generation circuit 62.

Figure 8:
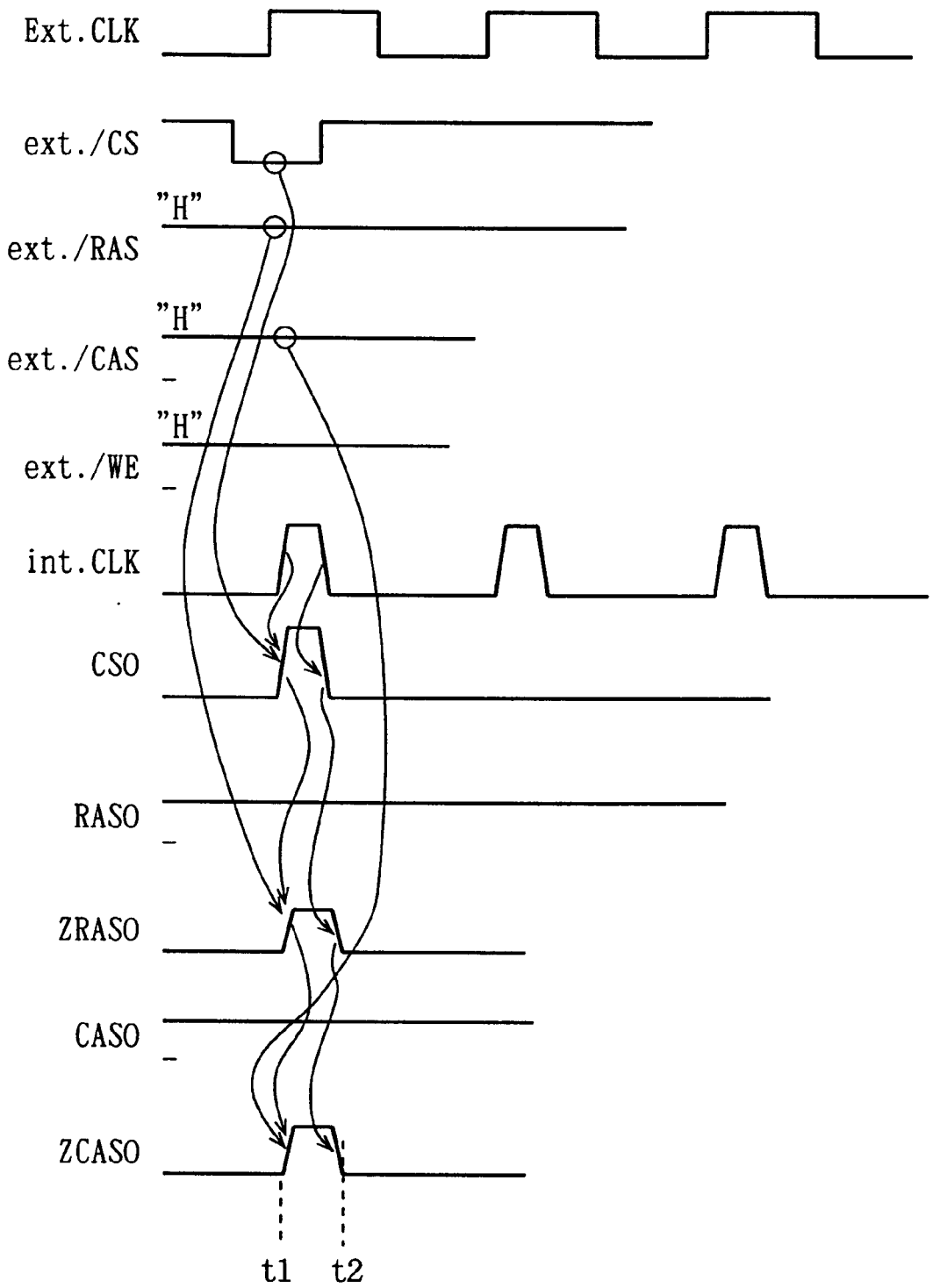
FIG. 8 is a timing chart for illustrating a change with time in a control signal for applying a NOP command.

FIG. 8 is a timing chart for illustrating the changes of these signals with time.

In response to activation of chip select signal ext./CS when external clock signal Ext.CLK rises at time point t1, one-shot pulse CS0 is generated in synchronization with internal clock signal int.CLK. Similarly, in response to inactivation of signal ext./RAS at the rising edge of external clock signal Ext.CLK at time point t1, one-shot pulse ZRAS0 is activated in synchronization with internal clock signal int.CLK.

Furthermore, in response to inactivation of signal ext./CAS at the rising edge of external clock signal Ext.CLK at time point t1, one-shot pulse ZCAS0 is activated in synchronization with internal clock signal int.CLK.

Since NAND circuit 402 shown in FIG. 7 receives these signals CS0, ZRAS0 and ZCAS0, the output signal of NAND circuit 402 shifts to a low level when a combination of the external control signals designates the NOP command, as is described with reference to FIG. 8. Responsively, power-down set signal PDS2 with a predetermined pulse width determined at delay stage 404 is output from NAND circuit 406.

Figure 9:
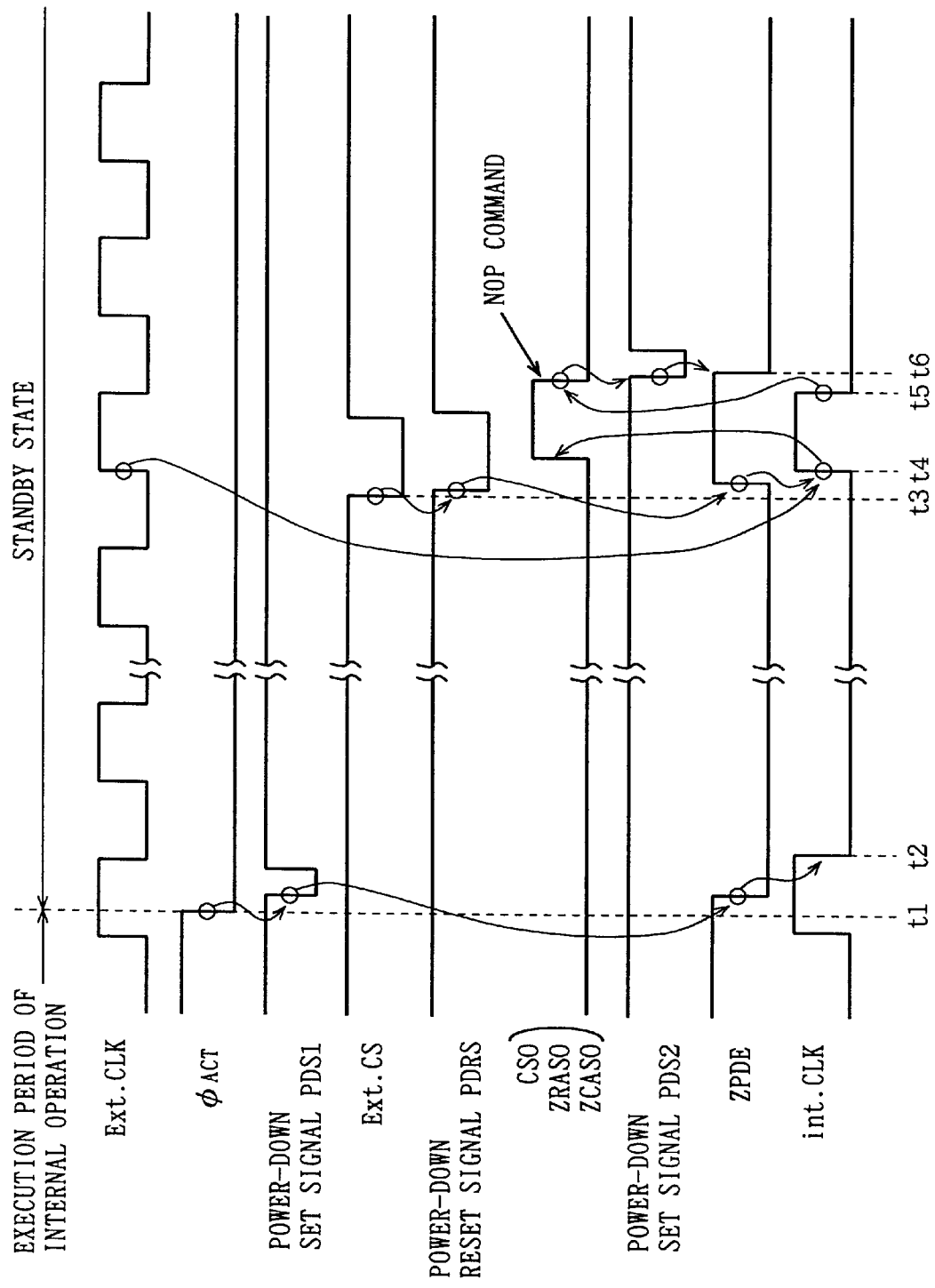
FIG. 9 is a timing chart for illustrating an operation of standby detection circuit 400 according to the second embodiment of the present invention.

FIG. 9 is a timing chart for illustrating an operation of standby detection circuit 400 shown in FIG. 7 and a change of internal clock signal int.CLK with time that is controlled by signal ZPDE output from the standby detection circuit and is thus generated.

When an operation of the internal circuit is completed at time point t1, signal $\phi_{ACT}$ changes from an active high level to an inactive low level. Responsively, power-down set signal PDS1 output from NAND circuit 220 shown in FIG. 7 attains an active state. In response to the activation of signal PDS1, clock activating signal ZPDE changes to a low level, and after internal clock signal int.CLK falls at time point t2, the internal clock signal int.CLK generating operation is stopped.

In other words, the operation for generating internal clock signal int.CLK is stopped when the operation of the internal circuit is stopped, as is described in the first embodiment with reference to FIG. 6.

Meanwhile, as described above, chip select signal ext./CS attains an active state when an NOP command is input to an SDRAM in a standby state. Thus, for standby detector circuit 200 according to the first embodiment, when an NOP command is input in a standby state, signal ZPDE will attain an active high level and an internal clock signal generating operation will be started.

More specifically, for the configuration of standby detector circuit 202 shown in FIG. 4 according to the first embodiment, signal ext./CS attains a low level and the latch circuit formed of gates 214 and 222 is reset to activate signal ZPDE, while a command for designating an internal operation will not be successively input only when the NOP command is applied. Thus, signal $\phi_{ACT}$ transits in an inactive low level and signal ZPDE will maintain a high level. Accordingly, when NOP command is designated in a standby state, an internal clock signal int.CLK generating operation will be stated inspite of the standby state.

By contrast, for standby detector circuit 400 shown in FIG. 7, such an operation as described below allows further electricity reduction in the internal clock signal int.CLK generating operation when an NOP command is designated in a standby operation.

More specifically, when an NOP command is input and signal ext./CS attains an inactive low level at time point t3, responsively power-down reset signal PDRS also changes to an active state. Responsively, signal ZPDE first changes to an active high level and this signal ZPDE controls internal clock signal int.CLK to change to an active state.

As has been described with reference to FIG. 8, however, when internal clock signal int.CLK rises at time point t4, responsively signal CS0, ZRAS0 and ZCAS0 each attain an active high level. Then, when signals CS0, ZRAS0 and ZCAS0 respond to the falling edge of internal clock signal int.CLK at time point t5 and each change to an inactive low level, power-down set signal PDS2 output from NAND circuit 406 shown in FIG. 7 responsively attains an active state. Thus, the state of the latch circuit formed of OR circuit 422 and NAND circuit 214 is changed to a set state, and signal ZPDE again changes to an inactive state at time point t6.

Thus, when an NOP command is applied in the SDRAM according to the second embodiment in a standby state, an internal clock signal int.CLK generating operation is not maintained in an active state and thus electricity consumption can be reduced.

In addition, electricity consumption in standby state will not be increased when clock rate is improved to improve an operating speed in the read or write operation of the SDRAM.

Third Embodiment

Figure 10:
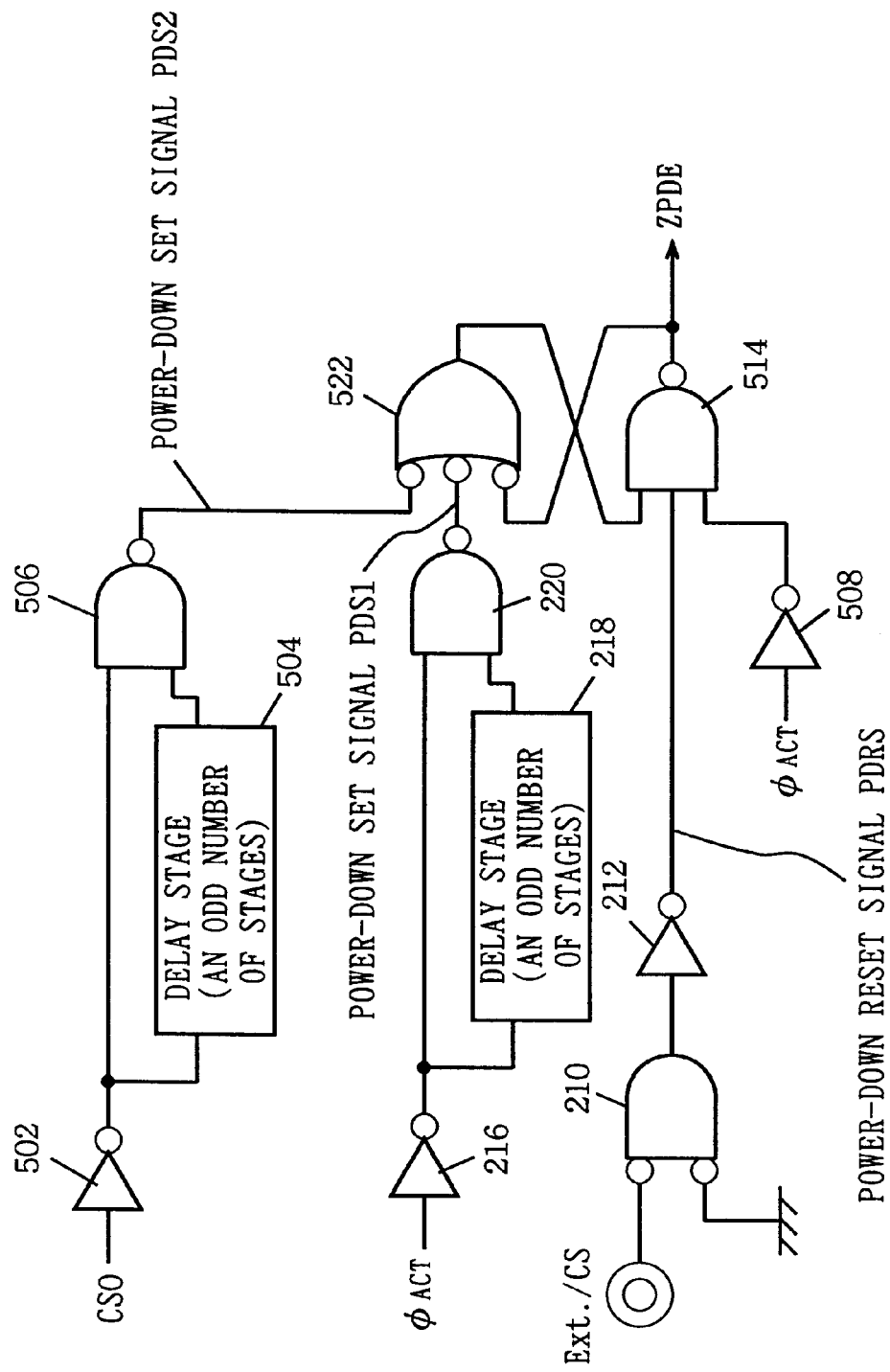
FIG. 10 is a schematic block diagram showing a configuration of a standby detection circuit 500 according to a third embodiment of the present invention.

FIG. 10 is a schematic block diagram showing a configuration of a standby detector circuit 500 according to a third embodiment of the present invention.

The configuration of standby detector circuit 500 according to the third embodiment differs from that of standby detector circuit 202 according to the first embodiment and shown in FIG. 4 in that standby detector circuit 500 includes an inverter 502 which receives, inverts and outputs signal CS0, a delay circuit 504 which receives, delays for a predetermined period of time and then inverts and outputs an output of inverter 502, and an NAND circuit 506 which receives outputs of inverter 502 and delay circuit 504 to output power-down set signal PDS2.

The configuration of standby detector circuit 500 is that of standby detector circuit 200 with NAND circuit 214 replaced with a 3-input NAND circuit 514 which receives a signal inverted by an inverter 508, i.e., the inverted version of signal $\phi_{ACT}$ at a first input node and power-down reset signal PDRS at a second input node to output signal ZPDE. Furthermore, standby detector circuit 500 is configured such that NAND circuit 222 is replaced with a 3-input NAND circuit 522 which receives signal ZPDE and power-down set signals PDS1 and PDS2. An output of 3-input NAND circuit 522 is input to a third input node of 3-input NAND circuit 514.

The rest of the configuration of standby detector circuit 500 is similar to the configuration of standby detector circuit 200 according to the first embodiment shown in FIG. 4, and thus identical components are designated by identical reference characters and a description there will not be repeated.

Figure 11:
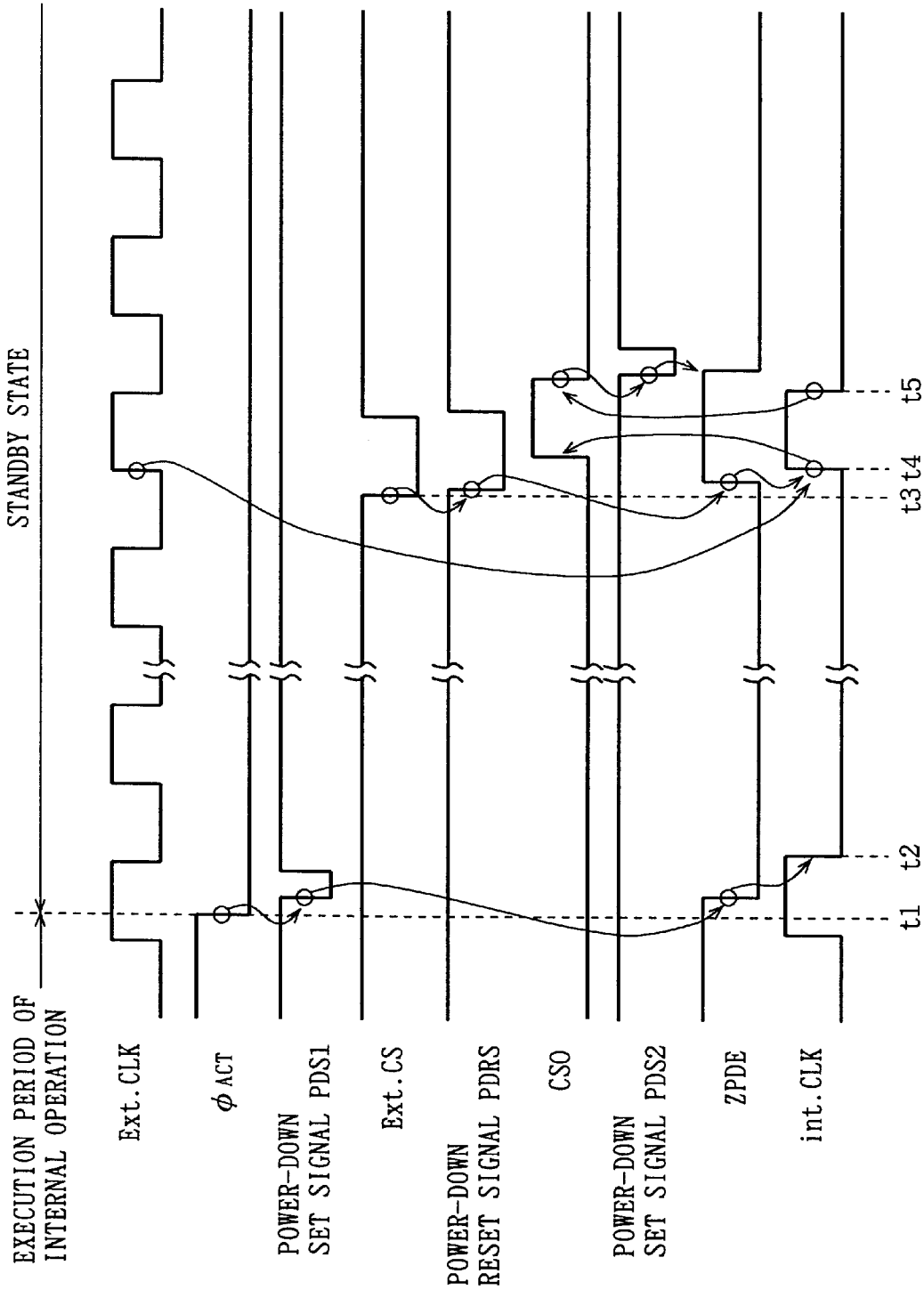
FIG. 11 is a timing chart for illustrating an operation of standby detection circuit 500.

FIG. 11 is a timing chart for illustrating an operation of standby detector circuit 500 according to the third embodiment shown in FIG. 10 and a change of internal clock signal int.CLK with time that is controlled by signal ZPDE output from standby detector circuit 500 and is thus generated.

When signal $\phi_{ACT}$ attains an active state at time point t1, responsively the first power-down set signal PDS1 attains an active state, signal ZPDE responsively attains an inactive low level and an internal clock signal int.CLK generating operation responsively stops at time point t2, which is similar to the operation of the internal clock generation circuit according to the first embodiment shown in FIG. 6.

Referring again to FIG. 11, when chip select signal ext./CS attains an active low level at time point t3, power-down reset signal PDRS responsively attains an active state and signal ZPDE responsively changes to an active high level. Controlled by signal ZPDE, an internal clock signal int.CLK generating operation is started at time point t4.

Signal CS0 is activated in response to the rising edge of internal clock signal int.CLK at time point t4, and is inactivated in response to the falling edge of internal clock signal int.CLK at time point t5. In response to the inactivation of signal CS0, the second power-down set signal PDS2 attains an active low level and responsively signal ZPDE again returns to an inactive low level.

More specifically, for the internal clock generation circuit according to the third embodiment, while the internal circuit of an SDRAM is performing its operation (signal $\phi_{ACT}$ is at a high level), the inverted version thereof is input to the first input node of NAND circuit 514 and signal ZPDE will thus be fixed at a high level. Furthermore, in standby state, as has been descried with reference to FIG. 11, when signal ext./CS attains an active low level, signal ZPDE first changes to a high level. However, when signal ext./CS returns to a high level and there is not any command input for activating the internal circuit, signal $\phi_{ACT}$ is maintained at the low level and thus signal ZPDE again returns to an inactive low level. Thus, as with the internal clock generation circuit according to the second embodiment, when an NOP command is externally applied in a standby state, the state will not be maintained in which an internal clock signal generating operation is started, and this suppresses increasing the electricity consumption in standby state.

Fourth Embodiment

Figure 12:
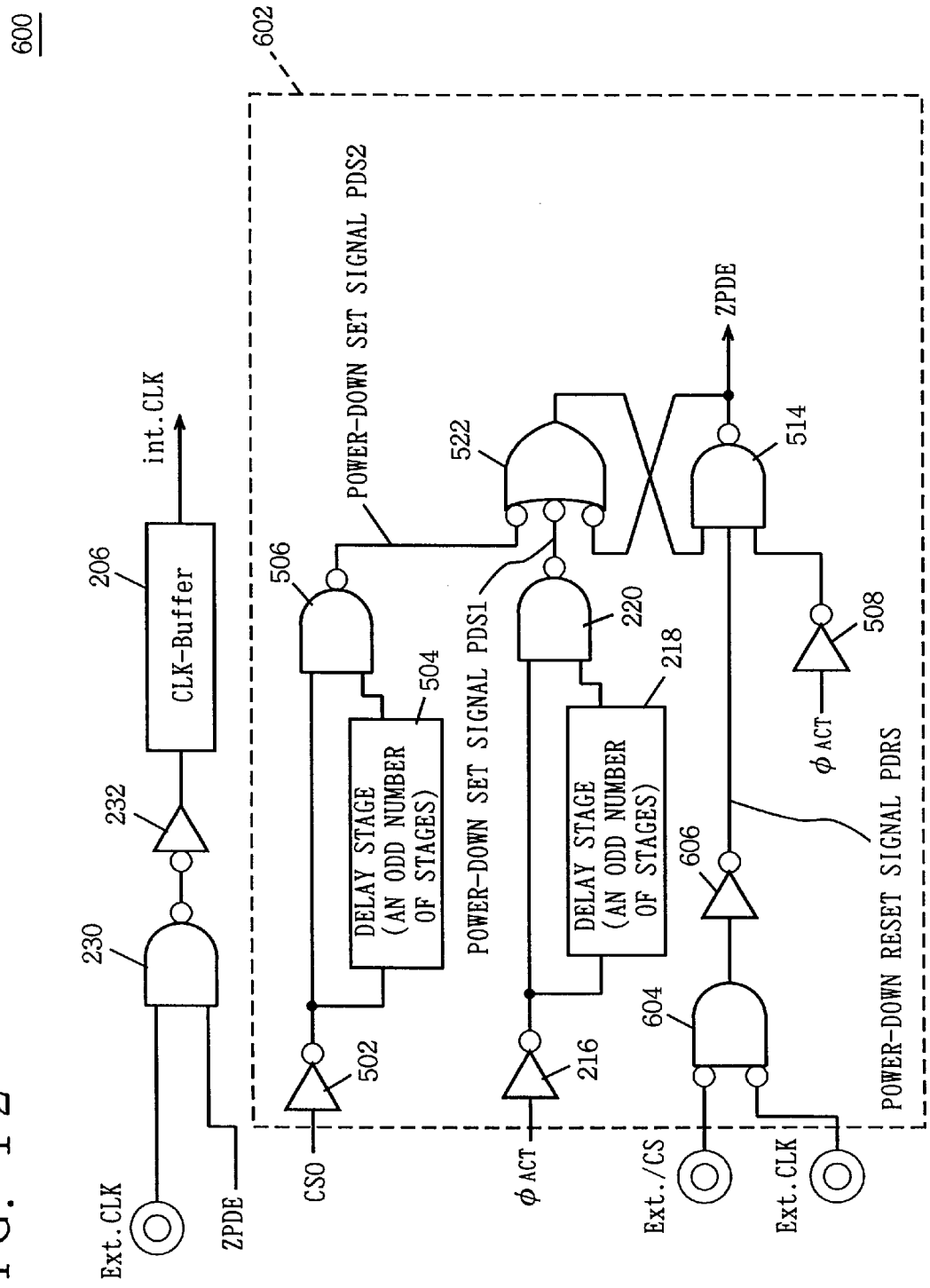
FIG. 12 is a schematic block diagram showing a configuration of an internal clock generation circuit 600 according to a fourth embodiment of the present invention.

FIG. 12 is a schematic block diagram showing a configuration of an internal clock generation circuit 600 according to a fourth embodiment of the present invention.

A standby detector circuit 602 in the configuration of internal clock generation circuit 600 is different in configuration from standby detector circuit 500 according to the third embodiment shown in FIG. 10 in that standby detector circuit 600 according to the fourth embodiment is configured such that power-down reset signal PDRS is output from an inverter 606 which receives an output of an AND circuit 604 which receives the inverted version of chip select signal ext./CS and the inverted version of external clock signal Ext.CLK.

The rest of the configuration is similar to the configuration of standby detector circuit 500 according to the third embodiment shown in FIG. 10, and thus identical components are designated by identical reference characters and a description thereof will not be repeated.

Signal ext./CS is input asynchronously with respect to the SDRAM. Thus, when signal ext./CS attains an active low level during a high level of external clock signal Ext.CLK, signal ZPDE immediately attains an active high level in standby detector circuit 200 according to the third embodiment and a signal with an insufficient pulse length will be inadvertently generated as internal clock signal int.CLK, as described hereinafter.

Figure 13:
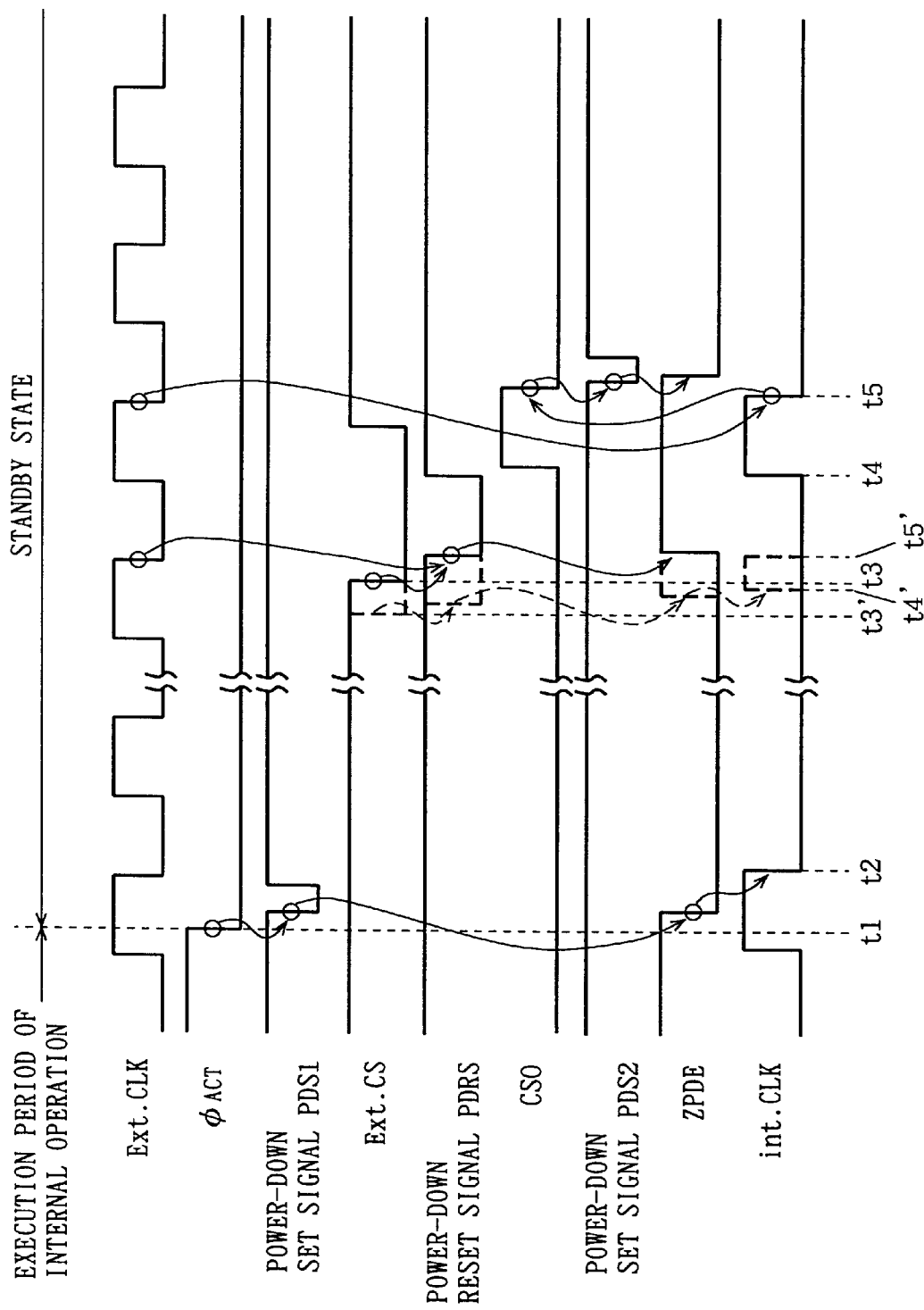
FIG. 13 is a timing chart for illustrating an operation of internal clock generation circuit 600.

FIG. 13 is a timing chart for illustrating an operation of the internal clock generation circuit shown in FIG. 12.

When signal $\phi_{ACT}$ falls to an inactive low level at time point tl, responsively power-down set signal PDS1 is activated and signal ZPDE falls to a low level. Responsively an internal clock signal int.CLK generating operation is stopped at time point t2.

For standby detector circuit 500 according to the third embodiment shown in FIG. 10, when chip select signal ext./CS falls to an active low level at time point t3', at which external clock signal Ext.CLK is at a high level and there is a sufficient time until it attains a low level, power-down reset signal PDRS responsively attains an active state and signal ZPDE rises to an active high level. Responsively internal clock signal int.CLK rises to a high level at time point t4', and in response to a falling edge of external clock signal Ext.CLK, internal clock signal int.CLK falls to a low level at time point t5'.

In other words, an internal clock signal int.CLK (indicated by a dot line in the figure) which is activated during the time period from time point t4' through time point t5' will be generated depending on the timing of activating external clock signal Ext.CLK and the timing of activating chip select signal ext./CS.

By contrast, with the standby detector circuit according to the fourth embodiment, a more complete internal clock signal can be generated rather than such an internal clock signal as described above, as indicated by the solid line in FIG. 13.

More specifically, even when chip select signal ext./CS attains an active low level at time point t3, power-down reset signal PDRS will not change to an active low level until external clock signal Ext.CLK falls. Accordingly, it is not until external clock signal Ext.CLK attains an inactive state that signal ZPDE attains an active high level. Thus, the change of internal clock signal int.CLK to an active high level due to the activation of signal ZPDE will be caused in response to the next rising edge of external clock signal Ext.CLK.

Thus, internal clock signal int.CLK rises to an active state at time point t4, and then falls to a low level at time point t5 responsively when external clock signal Ext.CLK falls again to a low level.

Responsively signal CS0 falls to a low level to change power-down set signal PDS2 to an active state. In response to the activation of signal PDS2, signal ZPDE again returns to an inactive low level.

The internal clock generation circuit according to the fourth embodiment is configured such that power-down reset signal PDRS is generated in response to signals Ext.CLK and ext./CS input to NOR circuit 604 so that signal ZPDE attains an active high level only when signals ext./CS and Ext.CLK each attain a low level, as has been described with reference to FIG. 13.

Thus, according to the fourth embodiment, internal clock signal int.CLK will not be erroneously generated depending on the timing of activating external clock signal Ext.CLK and the timing of activating chip select signal ext./CS.

Fifth Embodiment

Figure 14:
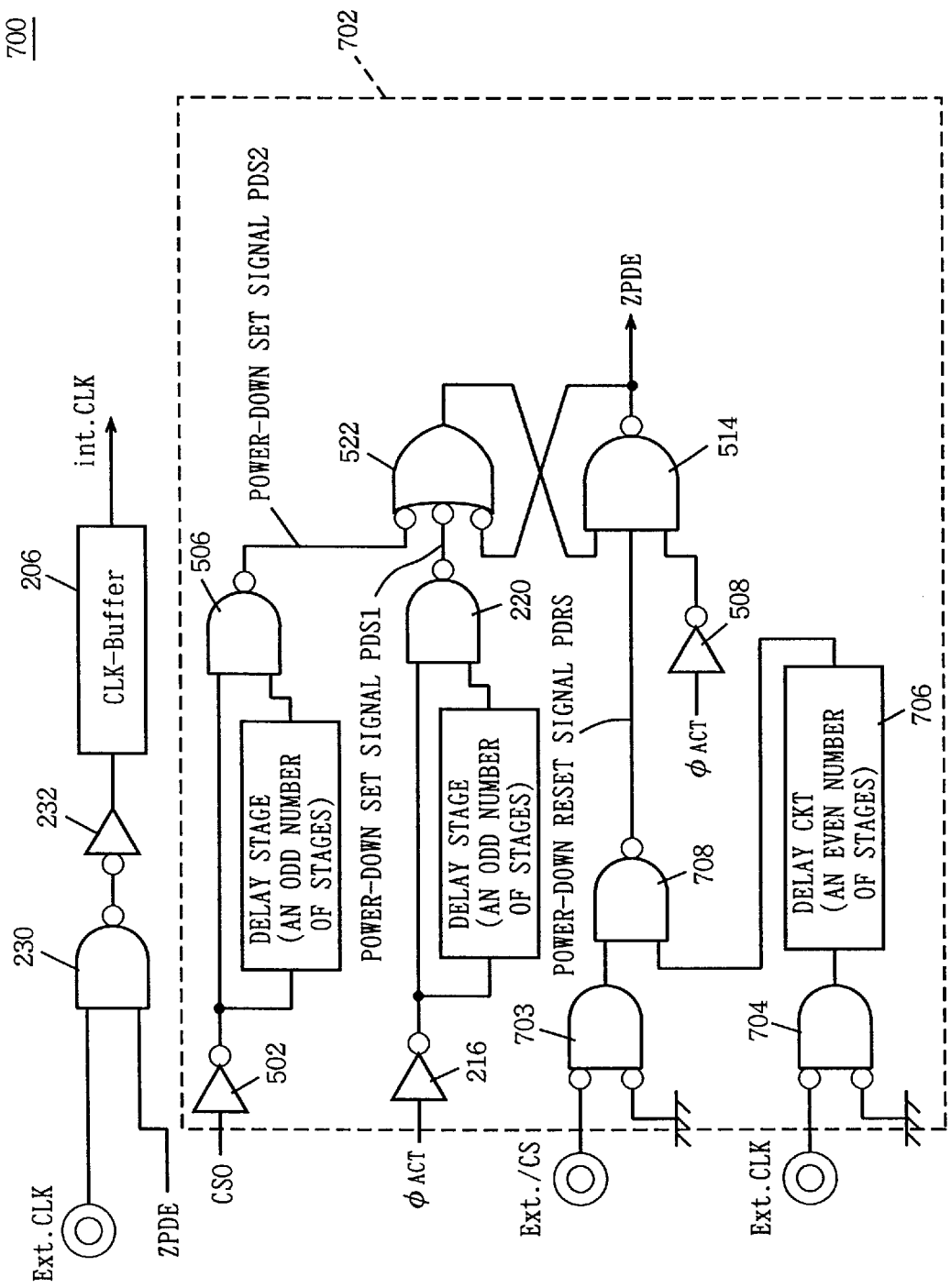
FIG. 14 is a schematic block diagram showing a configuration of an internal clock generation circuit 700 according to a fifth embodiment of the present invention.

FIG. 14 is a schematic block diagram showing a configuration of an internal clock generation circuit 700 according to a fifth embodiment of the present invention.

The configuration of internal clock generation circuit 700 differs from that of internal clock generation circuit 600 shown in FIG. 12 in that power-down reset signal PDRS is generated in a standby detector circuit 702 of the internal clock generation circuit according to the fifth embodiment, as described below.

More specifically, standby detector circuit 702 includes an NOR circuit 703 which receives chip select signal ext./CS at one input node and a ground potential at the other input node, an NOR circuit 704 which receives external clock signal Ext.CLK at one input node and a ground potential at the other input node, a delay circuit 706 which receives an output of NOR circuit 704 and outputs it after it is delayed for a predetermined period of time, and an NAND circuit 708 which receives an output of delay circuit 706 and an output of NOR circuit 703 to output power-down reset signal PDRS.

The rest of the configuration is similar to the configuration of the internal clock generation circuit according to the fourth embodiment shown in FIG. 12, and thus identical components are designated by identical reference characters and a description thereof will not be repeated.

For the internal clock generation circuit according to the fourth embodiment shown in FIG. 12, the possibility cannot be denied that power-down reset signal PDRS is not satisfactorily generated when external clock signal Ext.CLK attains a high level immediately after chip select signal ext./CS attains an active low level, i.e., when the set-up of chip select signal ext./CS is severe with respect to external clock signal Ext.CLK. By contrast, such a situation will not be caused in standby detector circuit 702 according to the fifth embodiment.

Figure 15:
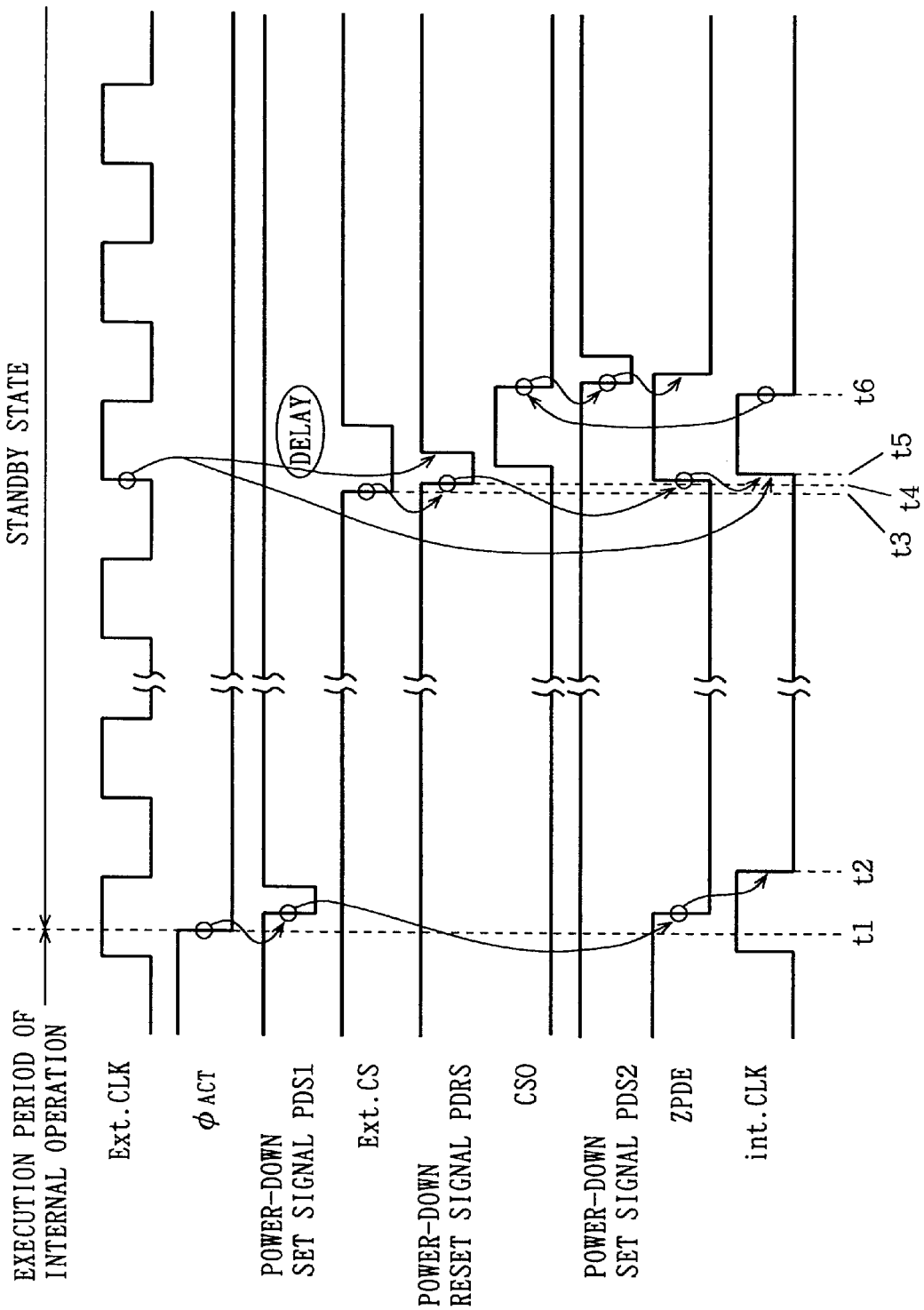
FIG. 15 is a timing chart for illustrating an operation of internal clock generation circuit 700.
Figure 16:
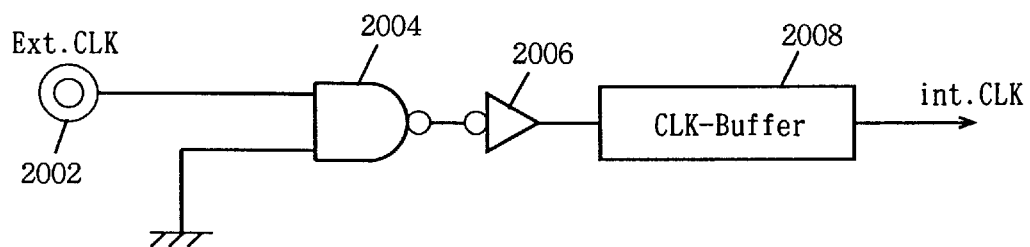
FIG. 16 is a schematic block diagram showing a configuration of a conventional internal clock generation circuit 2000.
Figure 17:
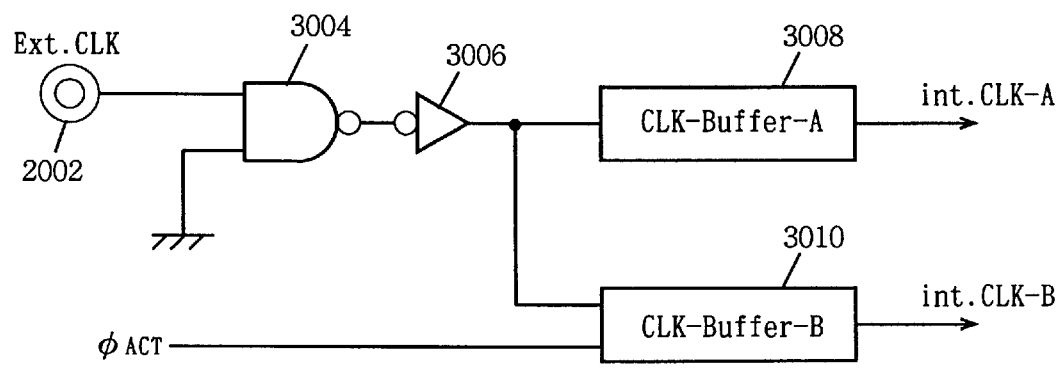
FIG. 17 is a schematic block diagram for showing a circuit configuration of an improved conventional internal clock generation circuit.

FIG. 15 is a timing chart for illustrating an operation of the internal clock generation circuit shown in FIG. 14.

The operation of the internal clock generation circuit shown in FIG. 14 is similar to that of the internal clock generation circuit according to the fourth embodiment shown in FIG. 13 in that when signal $\phi_{ACT}$ attains an inactive low level at time point t1, the internal clock signal ext./CS generating operation is responsively stopped at time point t2.

For the internal clock generation circuit according to the fifth embodiment, when external clock signal Ext.CLK attains a high level immediately after chip select signal ext./CS is activated at time point t3, the reset timing to inactivation (high level) of the power-down reset signal after its activation at time point t4 in response to a falling edge of chip select signal ext./CS is delayed from the time when external clock signal Ext.CLK rises to a high level by a time period determined by delay circuit 706.

Thus in this example also, the activation pulse of the power-down reset signal does not disadvantageously have an extraordinarily reduced pulse length.

When power-down reset signal PDRS is activated at time point t4, signal ZPDE responsively rises to a high level. When signal ZPDE is activated and external clock signal Ext.CLK rises to a high level, an internal clock signal int.CLK generating operation is responsively started at time point t5.

When internal clock signal int.CLK rises to a high level at time point t5 and then falls to a low level at time point t6, responsively signal CS0 also falls to a low level.

In response to the falling edge of signal CS0, power-down set signal PDS2 attains an active low level and responsively signal ZPDE again returns to an inactive low level.

Thus, when an NOP command is input in the fifth embodiment in a standby state, the state that an internal clock signal int.CLK generating operation has been started is not maintained and the electricity consumption in the standby state can thus be suppressed.

In addition, even when external clock signal Ext.CLK rises to a high level immediately after activation of chip select signal ext./CS, the generation of power-down reset signal PDRS is ensured and accordingly, standby detector circuit 702 will not erroneously operate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device synchronized with an external clock signal formed of a train of pulses to receive a plurality of external signals including a control signal and an address signal and to output stored data, comprising:

a memory cell array including a plurality of memory cells arranged in a matrix;

internal clock generating means receiving said external clock signal for generating an internal clock signal, said internal clock generating means activating an operation for generating said internal clock signal in response to activation of a chip select signal which designates enabling a communication of said external signals between said synchronous semiconductor memory device and an external, and inactivating said operation for generating said internal clock signal in response to inactivation of an internal circuit activating signal which activates an operation for selecting said memory cells;

control means responsive to said external signals for outputting said internal circuit activating signal, and responsive to said internal clock signal and said external signals for controlling a data input/output operation of said synchronous semiconductor memory device;

select means controlled by said control means, synchronized with said internal clock signal and responsive to said address signal for selecting a corresponding memory cell of said memory cell array; and data input/output means synchronized with said internal clock signal for receiving and transmitting stored data between said selected memory cell and the external.

2. The synchronous semiconductor memory device according to claim 1, wherein:

said external signals include an external row address strobe signal, an external column address strobe signal and an external write enable signal; and said control means responsively activates said internal circuit activating signal when said external row address strobe signal is in an active state and said column address signal and said write enable signal are each in an inactive state at an activating edge of said external clock signal.

3. The synchronous semiconductor memory device according to claim 1, wherein said internal clock generating means includes:

clock input control means controlled by a clock activating signal for starting and stopping outputting said external clock signal externally received;

standby detector means responsive to activation of said chip select signal for activating said clock activating signal, and responsive to inactivation of said internal circuit activating signal for inactivating said clock activating signal; and clock buffer means receiving and converting an output of said clock input control means into an internal clock signal.

4. The synchronous semiconductor memory device according to claim 3, wherein said standby detector means includes:

a chip select signal buffer responsive to an activating edge of said chip select signal for activating a power-down reset signal;

first pulse generating means responsive to inactivation of said internal circuit activating signal for outputting a power-down set signal with a predetermined pulse length;

a first 2-input NAND gate receiving said clock activating signal at a first input node and said power-down set signal at a second input node; and a second 2-input NAND gate receiving said power-down reset signal at a first input node and an output of said first 2-input NAND gate at a second input node and outputting said clock activating signal.

5. The synchronous semiconductor memory device according to claim 1, wherein:

said control means outputs a standby designating signal for designating a standby operation of said synchronous semiconductor memory device in response to activation of said chip select signal and said external signals while said internal circuit activating signal is inactivated; and said internal clock generating means includes clock input control means controlled by a clock activating signal for starting and stopping outputting said external clock signal externally received;

standby detector means responsive to activation of said chip select signal for activating said clock activating signal, and responsive to any of inactivation of said internal circuit activating signal and activation of said standby designating signal for inactivating said clock activating signal; and clock buffer means receiving and converting an output of said clock input control means into an internal clock signal.

6. The synchronous semiconductor memory device according to claim 5, wherein:

said external signals include an external row address strobe signal, an external column address strobe signal and an external write enable signal; and said control means responsively activates said standby designating signal when said chip select signal is in an active state and said external row address strobe signal, said column address strobe signal and said write enable signal are each in an inactive state at an activating edge of said external clock signal.

7. The synchronous semiconductor memory device according to claim 5, wherein said standby detector means includes:

a chip select signal buffer responsive to an activating edge of said chip select signal for activating a power-down reset signal;

first pulse generating means responsive to inactivation of said internal circuit activating signal for outputting a first power-down set signal with a predetermined pulse length;

second pulse generating means responsive to activation of said standby designating signal for outputting a second power-down set signal with a predetermined pulse length;

a 3-input NAND gate receiving said clock activating signal at a first input node, said first power-down set signal at a second input node, and said second power-down set signal at a third input node; and a 2-input NAND gate receiving said power-down reset signal at a first input node and an output of said 3-input NAND gate at a second input node and outputting said clock activating signal.

8. The synchronous semiconductor memory device according to claim 1, wherein said internal clock generating means includes:

clock input control means controlled by a clock activating signal for starting and stopping outputting said external clock signal externally received;

standby detector means activating said clock activating signal while said internal circuit activating signal is activated, and activating said clock activating signal in response to activation of said chip select signal and inactivating said clock activating signal in response to inactivation of said chip select signal while said internal circuit activating signal is inactivated; and clock buffer means receiving and converting an output of said clock input control means into an internal clock signal.

9. The synchronous semiconductor memory device according to claim 8, wherein said standby detector means includes:

a chip select signal buffer responsive to an activating edge of said chip select signal for activating a power-down reset signal;

first pulse generating means responsive to inactivation of said internal circuit activating signal for outputting a first power-down set signal with a predetermined pulse length;

second pulse generating means responsive to an inactivating edge of an internal clock signal generated after activation of said chip select signal, for outputting a second power-down set signal with a predetermined pulse length;

a first 3-input NAND gate receiving said clock activating signal at a first input node, said first power-down set signal at a second input node, and said second power-down set signal at a third input node; and a second 3-input NAND gate receiving an inverted version of said internal circuit activating signal at a first input node, said power-down reset signal at a second input node, and an output of said first 3-input NAND gate at a third input node, and outputting said clock activating signal.

10. The synchronous semiconductor memory device according to claim 8, wherein said standby detector means includes;

a chip select signal buffer responsive to activation of said chip select signal and inactivation of an external clock signal for activating a power-down reset signal;

first pulse generating means responsive to inactivation of said internal circuit activating signal for outputting a first power-down set signal with a predetermined pulse length;

second pulse generating means responsive to an inactivating edge of an internal clock signal generated after activation of said chip select signal, for outputting a second power-down set signal with a predetermined pulse length;

a first 3-input NAND gate receiving said clock activating signal at a first input node, said first power-down set signal at a second input node, and said second power-down set signal at a third input node; and a second 3-input NAND gate receiving an inverted version of said internal circuit activating signal at a first input node, said power-down reset signal at a second input node, and an output of said first 3-input NAND gate at a third input node, and outputting said clock activating signal.

11. The synchronous semiconductor memory device according to claim 8, wherein said standby detector means includes:

a chip select signal buffer responsive to activation of said chip select signal and to an elapse of a predetermined time period after inactivation of an external clock signal, for activating a power-down reset signal;

first pulse generating means responsive to inactivation of said internal circuit activating signal for outputting a first power-down set signal with a predetermined pulse length;

second pulse generating means responsive to an inactivating edge of an internal clock signal generated after activation of said chip select signal, for outputting second power-down set signal with a predetermined pulse length;

a first 3-input NAND gate receiving said clock activating signal at a first input node, said first power-down set signal at a second input node, and said second power-down set signal at a third input node; and a second 3-input NAND gate receiving an inverted version of said internal circuit activating signal at a first input node, said power-down reset signal at a second input node, and an output of said first 3-input NAND gate at a third input node, and outputting said clock activating signal.

* * * * *

UNITED STATES PATENT AND TRADEMARK OFFICE
CERTIFICATE OF CORRECTION

PATENT NO. : 5,926,434
DATED : 7/20/99
INVENTOR(S) : Shigeru MORI

It is certified that error appears in the above-identified patent and that said Letters Patent is hereby corrected as shown below:

Column 10, line 31, change "ext.RAS" to --ext./RAS

Column 15, line 23, change "200" to --202--

Column 15, line 36, change "200" to --202--

Column 16, line 39, change "200" to --500-

Signed and Sealed this

Twenty-ninth Day of February, 2000

Attest:

Q. TODD DICKINSON

*Attesting Officer*    *Commissioner of Patents and Trademarks*